United States Patent
Olson et al.

(10) Patent No.: US 11,110,689 B2
(45) Date of Patent: *Sep. 7, 2021

(54) PRESSURE SENSITIVE ADHESIVE COMPOSITION INCLUDING ULTRAVIOLET LIGHT-ABSORBING OLIGOMER

(71) Applicant: 3M INNOVATIVE PROPERTIES COMPANY, St. Paul, MN (US)

(72) Inventors: David B. Olson, Hudson, WI (US); Patricia M. Savu, Maplewood, MN (US); Diane North, Inver Grove Heights, MN (US); Jordan C. DuCharme, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 335 days.

This patent is subject to a terminal disclaimer.

(21) Appl. No.: 15/320,551

(22) PCT Filed: Jun. 25, 2015

(86) PCT No.: PCT/US2015/037747
§ 371 (c)(1),
(2) Date: Dec. 20, 2016

(87) PCT Pub. No.: WO2015/200669
PCT Pub. Date: Dec. 30, 2015

(65) Prior Publication Data
US 2017/0198177 A1 Jul. 13, 2017

Related U.S. Application Data

(60) Provisional application No. 62/017,666, filed on Jun. 26, 2014.

(51) Int. Cl.
*B32B 27/06* (2006.01)
*C09J 133/08* (2006.01)
(Continued)

(52) U.S. Cl.
CPC .............. *B32B 27/06* (2013.01); *B32B 7/12* (2013.01); *B32B 27/00* (2013.01); *B32B 27/08* (2013.01); *B32B 27/16* (2013.01); *B32B 27/18* (2013.01); *B32B 27/281* (2013.01); *B32B 27/285* (2013.01); *B32B 27/286* (2013.01); *B32B 27/288* (2013.01); *B32B 27/302* (2013.01); *B32B 27/304* (2013.01); *B32B 27/306* (2013.01); *B32B 27/308* (2013.01); *B32B 27/32* (2013.01); *B32B 27/34* (2013.01); *B32B 27/36* (2013.01); *B32B 27/365* (2013.01); *B32B 27/38* (2013.01); *B32B 27/40* (2013.01); *B32B 27/42* (2013.01); *C08F 220/18* (2013.01); *C09J 4/00* (2013.01); *C09J 7/22* (2018.01); *C09J 7/38* (2018.01); *C09J 133/066* (2013.01); *C09J 133/08* (2013.01); *C09J 133/14* (2013.01); *H01L 31/048* (2013.01); *H01L 31/0481* (2013.01); *B32B 2250/03* (2013.01); *B32B 2250/05* (2013.01); *B32B 2250/24* (2013.01); *B32B 2255/10* (2013.01); *B32B 2255/26* (2013.01); *B32B 2270/00* (2013.01); *B32B 2307/416* (2013.01); *B32B 2307/50* (2013.01); *B32B 2307/542* (2013.01); *B32B 2307/548* (2013.01); *B32B 2307/554* (2013.01); *B32B 2307/558* (2013.01); *B32B 2307/71* (2013.01); *B32B 2307/712* (2013.01); *B32B 2307/7244* (2013.01); *B32B 2307/7265* (2013.01); *B32B 2307/732* (2013.01); *B32B 2307/752* (2013.01);
(Continued)

(58) Field of Classification Search
CPC .. C09J 133/066; C09J 133/14; C09J 133/064; C09J 133/08–10; C08L 33/08–10; C08L 33/064; C08F 220/1808
See application file for complete search history.

(56) References Cited

U.S. PATENT DOCUMENTS 2,803,615 A  8/1957  Ahlbrecht
RE24,906 E  12/1960  Ulrich
(Continued)

FOREIGN PATENT DOCUMENTS

DE  102013217785 A1 *  3/2015  .............. C09J 7/385
EP  0870778  10/1998
(Continued)

OTHER PUBLICATIONS

Machine Translation of JP06-299132A. Oct. 25, 1994 (Year: 1994).*
Bahadur, et al. Principles of Polymer Science. Alpha Science International Ltd. 2002. Section 3.3. pp. 110-120. (Year: 2002).*
Machine Translation of DE102013217785A1. Mar. 5, 2015. (Year: 2015).*
Machine Translation of JP2000-123621. Apr. 28, 2000. (Year: 2000).*
(Continued)

*Primary Examiner* — Stephen E Rieth
(74) *Attorney, Agent, or Firm* — Kathleen B. Gross

(57) ABSTRACT

A composition that includes a blend of a pressure sensitive adhesive and an ultraviolet light-absorbing oligomer. The oligomer has a first divalent unit having a pendent ultraviolet absorbing group and a second divalent unit represented by formula in which $R^1$ is hydrogen or methyl, and $R^2$ is alkyl having from 4 to 20 carbon atom. Articles including the composition are disclosed. For example, an assembly including a barrier film and the composition is also disclosed.

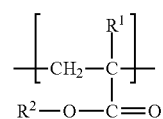

19 Claims, No Drawings

(51) Int. Cl.

| | | |
|---|---|---|
| *H01L 31/048* | (2014.01) | |
| *C09J 133/06* | (2006.01) | |
| *C09J 133/14* | (2006.01) | |
| *C09J 7/38* | (2018.01) | |
| *B32B 27/00* | (2006.01) | |
| *B32B 27/30* | (2006.01) | |
| *C08F 220/18* | (2006.01) | |
| *B32B 27/08* | (2006.01) | |
| *B32B 7/12* | (2006.01) | |
| *C09J 4/00* | (2006.01) | |
| *C09J 7/22* | (2018.01) | |
| *B32B 27/38* | (2006.01) | |
| *B32B 27/28* | (2006.01) | |
| *B32B 27/36* | (2006.01) | |
| *B32B 27/18* | (2006.01) | |
| *B32B 27/32* | (2006.01) | |
| *B32B 27/34* | (2006.01) | |
| *B32B 27/42* | (2006.01) | |
| *B32B 27/40* | (2006.01) | |
| *B32B 27/16* | (2006.01) | |

(52) U.S. Cl.
CPC ........ *B32B 2451/00* (2013.01); *B32B 2457/12* (2013.01); *B32B 2605/00* (2013.01); *C08F 220/1808* (2020.02); *C09J 2203/306* (2013.01); *C09J 2203/322* (2013.01); *C09J 2433/00* (2013.01); *Y02E 10/50* (2013.01)

(56) References Cited

U.S. PATENT DOCUMENTS

| | | |
|---|---|---|
| 3,423,360 A | 1/1969 | Huber et al. |
| 3,553,179 A | 1/1971 | Bartlett |
| 4,329,384 A | 5/1982 | Vesley |
| 4,330,590 A | 5/1982 | Vesley |
| 4,379,201 A | 4/1983 | Heilmann |
| 4,508,882 A | 4/1985 | Yoshida et al. |
| 4,696,719 A | 9/1987 | Bischoff |
| 4,722,515 A | 2/1988 | Ham |
| 4,737,559 A * | 4/1988 | Kellen .............. C09J 7/385 526/291 |
| 4,804,717 A | 2/1989 | Ramey et al. |
| 4,842,893 A | 6/1989 | Yializis |
| 4,954,371 A | 9/1990 | Yializis |
| 5,018,048 A | 5/1991 | Shaw |
| 5,032,461 A | 7/1991 | Shaw |
| 5,073,611 A | 12/1991 | Rehmer |
| 5,084,537 A | 1/1992 | Stoyan |
| 5,097,800 A | 3/1992 | Shaw |
| 5,100,963 A * | 3/1992 | Lin .............. C08L 33/08 525/221 |
| 5,125,138 A | 6/1992 | Shaw |
| 5,157,091 A | 10/1992 | Masataka |
| 5,198,498 A | 3/1993 | Valet |
| 5,254,608 A | 10/1993 | McClure |
| 5,286,781 A | 2/1994 | Gotoh |
| 5,420,204 A | 5/1995 | Valet |
| 5,440,446 A | 8/1995 | Shaw |
| 5,540,978 A | 7/1996 | Schrenk |
| 5,547,908 A | 8/1996 | Furuzawa |
| 5,672,704 A | 9/1997 | Toan |
| 5,723,513 A | 3/1998 | Bonham |
| 5,807,635 A | 9/1998 | Cogen |
| 5,986,011 A | 11/1999 | Ellis |
| 6,045,864 A | 4/2000 | Lyons |
| 6,214,422 B1 | 4/2001 | Yializis |
| 6,231,939 B1 | 5/2001 | Shaw |
| 6,251,521 B1 | 6/2001 | Eian |
| 6,261,676 B1 | 7/2001 | Olson |
| 6,312,802 B1 | 11/2001 | Nishida |
| 6,335,102 B1 | 1/2002 | Tsubaki |
| 6,352,778 B1 | 3/2002 | Gillette |
| 6,414,236 B1 | 7/2002 | Kataoka |
| 6,500,887 B1 | 12/2002 | Tobita |
| 6,524,686 B2 | 2/2003 | Strassel |
| 6,582,790 B2 | 6/2003 | Olson |
| 6,664,354 B2 | 12/2003 | Savu |
| 6,777,079 B2 | 8/2004 | Zhou |
| 6,923,921 B2 | 8/2005 | Flynn |
| 7,018,713 B2 | 3/2006 | Padiyath |
| 7,101,618 B2 | 9/2006 | Coggio |
| 7,236,290 B1 | 6/2007 | Zhang |
| 7,682,771 B2 | 3/2010 | Liu et al. |
| 7,935,772 B2 | 5/2011 | Makuda |
| 7,993,680 B2 | 8/2011 | Clemente |
| 8,722,791 B2 | 5/2014 | Saito |
| 9,371,471 B2 | 6/2016 | Palasz |
| 9,441,135 B2 | 9/2016 | Klun et al. |
| 9,670,300 B2 | 6/2017 | Olson |
| 2003/0012912 A1 | 1/2003 | Olson |
| 2004/0191550 A1 | 9/2004 | Maekawa |
| 2005/0129569 A1 | 6/2005 | Zhao et al. |
| 2005/0277729 A1* | 12/2005 | Tsunemine ............... C09J 11/06 524/558 |
| 2007/0166562 A1 | 7/2007 | Swei |
| 2007/0276107 A1 | 11/2007 | Wada |
| 2009/0104447 A1 | 4/2009 | Kita |
| 2009/0280322 A1* | 11/2009 | Daniels .............. C08J 3/28 428/354 |
| 2009/0283144 A1 | 11/2009 | Hebrink |
| 2010/0055418 A1 | 3/2010 | Takamatsu |
| 2010/0189983 A1 | 7/2010 | Numrich |
| 2011/0065826 A1 | 3/2011 | Shimohara |
| 2011/0151229 A1 | 6/2011 | Morita |
| 2011/0297228 A1 | 12/2011 | Li |
| 2012/0003451 A1 | 1/2012 | Weigel |
| 2012/0003484 A1 | 1/2012 | Roehrig |
| 2012/0011850 A1 | 1/2012 | Hebrink |
| 2012/0097220 A1 | 4/2012 | Miyashita |
| 2012/0227809 A1 | 9/2012 | Bharti |
| 2013/0096273 A1 | 4/2013 | Benz |
| 2014/0120268 A1 | 5/2014 | Akiyama et al. |
| 2015/0086782 A1* | 3/2015 | Kase .............. C09J 133/08 428/355 CN |
| 2015/0337096 A1 | 11/2015 | Olson |
| 2016/0200884 A1 | 7/2016 | Konokawa |
| 2016/0200947 A1* | 7/2016 | Husemann ............. C09J 7/385 156/331.7 |
| 2017/0198119 A1 | 7/2017 | Olson |
| 2017/0198129 A1 | 7/2017 | Olson |

FOREIGN PATENT DOCUMENTS

| | | |
|---|---|---|
| EP | 0939441 | 9/1999 |
| EP | 1065731 | 1/2001 |
| EP | 1311637 | 5/2003 |
| GB | 229823 | 5/1925 |
| GB | 1407670 | 9/1975 |
| JP | 51-76345 | 7/1976 |
| JP | S56163140 A | 12/1981 |
| JP | 4216807 | 8/1992 |
| JP | H04311754 A | 11/1992 |
| JP | 06299132 A * | 10/1994 |
| JP | 7-3242 | 1/1995 |
| JP | 7-310061 | 11/1995 |
| JP | H08188737 | 7/1996 |
| JP | 9-52916 | 2/1997 |
| JP | 9-59560 | 3/1997 |
| JP | 9-239921 | 9/1997 |
| JP | 10-7998 | 1/1998 |
| JP | 10-53681 | 2/1998 |
| JP | 10-130456 | 5/1998 |
| JP | 10-168408 | 6/1998 |
| JP | 10-279832 | 10/1998 |
| JP | 11-293180 | 10/1999 |
| JP | 11-293181 | 10/1999 |
| JP | 11-348199 | 12/1999 |
| JP | 2000-123621 | 4/2000 |
| JP | 2000-154497 | 6/2000 |
| JP | 2001-1478 | 1/2001 |

(56) References Cited

FOREIGN PATENT DOCUMENTS

| | | |
|---|---|---|
| JP | 2001-19895 | 1/2001 |
| JP | 2001-123107 | 5/2001 |
| JP | 2001-323209 | 11/2001 |
| JP | 2002-60575 | 2/2002 |
| JP | 2002-146155 | 5/2002 |
| JP | 2002-194266 | 7/2002 |
| JP | 2002-201420 | 7/2002 |
| JP | 2002-256217 | 9/2002 |
| JP | 2003-40937 | 2/2003 |
| JP | 2003-129033 | 5/2003 |
| JP | 2003-266449 | 9/2003 |
| JP | 2004-148542 | 5/2004 |
| JP | 2004-161800 | 6/2004 |
| JP | 2004-217695 | 8/2004 |
| JP | 2005-42019 | 2/2005 |
| JP | 2005-187662 | 7/2005 |
| JP | 2005-290269 | 10/2005 |
| JP | 2007-204678 | 8/2007 |
| JP | 2007-297619 | 11/2007 |
| JP | 2010-126690 | 6/2010 |
| JP | 2010-138299 | 6/2010 |
| JP | 2011-68708 | 4/2011 |
| JP | 2012-72333 | 4/2012 |
| JP | 2012-111811 | 8/2012 |
| JP | 2012-188620 | 10/2012 |
| KR | 2006-0130397 | 12/2006 |
| KR | 20070047863 | 5/2007 |
| KR | 2009-0089088 | 8/2009 |
| KR | 2014-0074581 | 6/2014 |
| WO | WO 2000-26973 | 5/2000 |
| WO | WO 2005-058377 | 6/2005 |
| WO | WO 2006-071981 | 7/2006 |
| WO | WO 2011/013638 | 2/2011 |
| WO | WO 2011-071847 | 6/2011 |
| WO | WO 2011-113008 | 9/2011 |
| WO | WO 2013-096543 | 6/2013 |
| WO | WO-2013147101 A1 * 10/2013 ............ C09J 133/08 |
| WO | WO 2013-172930 | 11/2013 |
| WO | WO 2014-025983 | 2/2014 |
| WO | WO-2015032635 A1 * 3/2015 ............ C09J 11/06 |
| WO | WO 2016-210140 | 12/2016 |

OTHER PUBLICATIONS

Benzene. NIST Chemical Webbook, SRD 69. https://webbook.nist.gov/cgi/cbook.cgi?ID=C71432&Mask=400#UV-Vis-Spec. As viewed on Jul. 28, 2020. (Year: 2020).*

Cameron, G. G.; Stewart, D. Spin-label study of immiscible polymers: 4. Location of chain ends in blends of poly(methyl methacrylate) and poly(2-ethylhexyl methacrylate). Polymer, 1994, 35(16), 3384-3388. (Year: 1994).*

Human translation of JP 08-188737 (1996, 28 pages).

Affinito, "Polymer-Oxide Transparent Barrier Layers", Society of Vacuum Coaters 39th Annual Technical Conference Proceedings, 1996, pp. 392-397.

Affinito, "Vacuum deposited polymer/metal multilayer films for optical application", Thin Solid Films, 1995, vol. 270, pp. 43-48.

Satas, "Handbook of Pressure Sensitive Adhesive Technology", 172-173 (1989).

Shaw, "A New High Speed Process for Vapor Depositing Acrylate Thin Films: An Update", Society of Vacuum Coaters 36th Annual Technical Conference Proceedings, Apr. 25-30, 1993, pp. 348-352.

Shaw, "A New Vapor Deposition Process for Coating Paper and Polymer Webs", 6th International Vacuum Coating Conference in Reno, Oct. 28, 1992, p. 18-24.

Shaw, "Use of Vapor Deposited Acrylate Coatings to Improve the Barrier Properties of Metallized Film", Society of Vacuum Coaters 37th Annual Technical Conference Proceedings, 1994, pp. 240-247.

Shaw, "Use of Evaporated Acrylate Coatings to Smooth the Surface of Polyester and Polypropylene Film Substrates", RadTech, 1996, pp. 701-707.

International Search report for PCT International Application No. PCT/US2015/037747 dated Oct. 14, 2015, 3 pages.

* cited by examiner

PRESSURE SENSITIVE ADHESIVE COMPOSITION INCLUDING ULTRAVIOLET LIGHT-ABSORBING OLIGOMER

CROSS-REFERENCE TO RELATED APPLICATIONS

This application is a national stage filing under 35 U.S.C. 371 of PCT/US2015/037747, filed Jun. 25, 2015, which claims priority to U.S. Provision Application No. 62/017,666, filed Jun. 26, 2014, the disclosure of which is incorporated by reference in its entirety herein.

BACKGROUND

It may be desirable to incorporate ultraviolet absorbers (UVAs) into materials exposed to ultraviolet (UV) radiation, for example, to protect from UV degradation. Some UVAs can be dispersed into some compositions, but sometimes they can be lost due to volatilization or migration to the surface. Covalent incorporation of UVAs into pressure sensitive adhesive (PSA) compositions has been proposed (see JP2012188620 published Oct. 4, 2012.) Certain copolymers made from monomers having UV absorbing groups have been described for including in PSA compositions (see, JP2000123621, published Apr. 28, 2000).

SUMMARY

The present disclosure provides a composition that includes a pressure sensitive adhesive and an ultraviolet light-absorbing oligomer having a first divalent unit with a pendent ultraviolet absorbing group. The oligomers are generally quite compatible with pressure sensitive adhesives and do not migrate out of the adhesive. Compositions including the pressure sensitive adhesive and oligomers provide protection from ultraviolet light and have good transparency to visible and infrared light. These properties are typically well-maintained even after accelerated UV exposure and exposure to high temperature and humidity conditions.

In one aspect, the present disclosure provides a composition that includes a blend of a pressure sensitive adhesive and an ultraviolet light-absorbing oligomer. The ultraviolet light-absorbing oligomer includes a first divalent unit having a pendent ultraviolet absorbing group and a second divalent unit represented by formula:

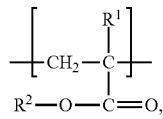

in which $R^1$ is hydrogen or methyl, and $R^2$ is alkyl having from 4 to 22 carbon atoms. In some embodiments, the pressure sensitive adhesive is an acrylic pressure sensitive adhesive comprising the second divalent unit, and wherein for at least some of the second divalent units in the pressure sensitive adhesive $R^2$ is alkyl having the same number of carbon atoms as at least some of the second divalent units in the ultraviolet light-absorbing oligomer.

The composition may be useful, for example, for adhering a film to a surface of an article or adhering any two surfaces together. Accordingly, in another aspect, the present disclosure provides an article that includes the composition. The article may be, for example, photovoltaic device or a film with the composition disposed on at least a portion of a surface thereof. The film may be, for example, a vehicle wrap, graphic film, architectural film, window film, or barrier film.

In another aspect, the present disclosure provides an assembly including a first polymeric film substrate having a first surface and a second surface opposite the first surface, a barrier film disposed on the first surface of the first polymeric film, a pressure sensitive adhesive layer having a first surface and a second surface opposite the first surface, with the first surface of the pressure sensitive adhesive disposed on the barrier film opposite the first polymeric film substrate, and a second polymeric film substrate disposed on the second surface of the pressure sensitive adhesive layer. The pressure sensitive adhesive layer includes an ultraviolet light-absorbing oligomer with a first divalent unit having a pendent ultraviolet absorbing group and a second divalent unit represented by formula:

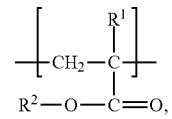

in which $R^1$ is hydrogen or methyl, and $R^2$ is alkyl having from 4 to 22 carbon atoms.

UVAs in pressure sensitive adhesives (PSA) are useful for protecting both the PSA and underlying films or structures from UV light. With conventional UVAs, there can be issues with migration out of the adhesive layer as well as agglomeration and resulting optical defects. The ultraviolet light-absorbing oligomers disclosed herein have superior compatibility in PSA formulations when compared to commercially available UVAs of the same class as evidenced by clarity and transmission of the PSAs. Furthermore, in some embodiments, the second divalent units and optionally third divalent units in the ultraviolet light-absorbing oligomers disclosed herein are the same as those in the PSA formulation. Increased compatibility as evidenced by clarity and transmission data is observed in these embodiments in comparison to oligomers in which the major portion is derived from methyl methacrylate.

In this application:

Terms such as "a", "an" and "the" are not intended to refer to only a singular entity, but include the general class of which a specific example may be used for illustration. The terms "a", "an", and "the" are used interchangeably with the term "at least one".

The phrase "comprises at least one of" followed by a list refers to comprising any one of the items in the list and any combination of two or more items in the list. The phrase "at least one of" followed by a list refers to any one of the items in the list or any combination of two or more items in the list.

The term "ultraviolet absorbing group" or ultraviolet light-absorbing group refers to a covalently attached ultraviolet absorber (UVA). UVAs are known to those skilled in the art as being capable of dissipating absorbed light energy from UV rays as heat by reversible intramolecular proton transfer. UVAs are selected such that the oligomers in any of the embodiments of oligomers or second oligomers disclosed herein absorbs at least 70%, 80%, or 90% of incident light in a wavelength range from 180 nanometers (nm) to 400 nm.

"Alkyl group" and the prefix "alk-" are inclusive of both straight chain and branched chain groups and of cyclic groups. Unless otherwise specified, alkyl groups herein have up to 20 carbon atoms. Cyclic groups can be monocyclic or polycyclic and, in some embodiments, have from 3 to 10 ring carbon atoms.

The phrase "interrupted by at least one —O— group", for example, with regard to an alkyl (which may or may not be fluorinated), alkylene, or arylalkylene refers to having part of the alkyl, alkylene, or arylalkylene on both sides of the —O— group. For example, —CH$_2$CH$_2$—O—CH$_2$—CH$_2$— is an alkylene group interrupted by an —O—.

The term "polymer" refers to a molecule having a structure which essentially includes the multiple repetition of units derived, actually or conceptually, from molecules of low relative molecular mass. The term "polymer" encompasses oligomers.

All numerical ranges are inclusive of their endpoints and nonintegral values between the endpoints unless otherwise stated (e.g., 1 to 5 includes 1, 1.5, 2, 2.75, 3, 3.80, 4, 5, etc.).

DETAILED DESCRIPTION

Ultraviolet light-absorbing oligomers useful in the compositions according to the present disclosure are linear or branched. Typically, they are linear oligomers. They may be random copolymers or block copolymers. They are not covalently crosslinked. Accordingly, they may be dissolved in solvents and have measurable molecular weights as opposed to covalently crosslinked polymers, which cannot be dissolved in solvents and have molecular weights approaching infinity. In some embodiments, the oligomers may be considered thermoplastic. Thermoplastics are typically melt-processable such as by an extrusion process. Oligomers useful in the compositions according to the present disclosure have a number average molecular weight of up to 150,000 grams per mole. In some of these embodiments, the oligomer has a number average molecular weight of up to 120,000, 100,000, 90,000, 80,000, 70,000, 60,000, 50,000, 40,000, 30,000, 20,000, or less than 20,000 grams per mole (e.g., up to 19,500, 19,000, or 18,500 grams per mole). In some embodiments, the number average molecular weight of the oligomer may be at least 1000 grams per mole, greater than 5,000 grams per mole, or greater than 7,500 grams per mole. Useful ultraviolet light-absorbing oligomers typically have a distribution of molecular weights and compositions. Weight and number average molecular weights can be measured, for example, by gel permeation chromatography (i.e., size exclusion chromatography) using techniques known to one of skill in the art.

Ultraviolet light-absorbing oligomers useful in the compositions according to the present disclosure in any of their embodiments include a first divalent unit comprising a pendent ultraviolet absorbing (UVA) group. Any class of UVA may be useful for providing the UVA group. Examples of useful classes include benzophenones, benzotriazoles, triazines, cinnamates, cyanoacrylates, dicyano ethylenes, salicylates, oxanilides, and para-aminobenzoates. In some of these embodiments, the pendent ultraviolet absorbing group comprises a triazine, a benzophenone, or a benzotriazole. In some embodiments of the compositions according to the present disclosure, the pendent ultraviolet absorbing group is a triazine. In some embodiments, the pendent ultraviolet absorbing group has enhanced spectral coverage in the long-wave UV region (e.g., 315 nm to 400 nm), enabling it to block the high wavelength UV light that can cause yellowing in polymers. The first divalent unit can be considered to be a repeating unit in the ultraviolet absorbing oligomer.

In some of embodiments of the compositions or method according to the present disclosure, the first divalent unit may be represented by formula —[—CH$_2$—C(H)UVA-]—, —[—CH$_2$—C(H)C(O)—O—X-UVA-]-, —[—CH$_2$—C(H)C(O)—NH—X-UVA-]-, —[—CH$_2$—C(CH$_3$)C(O)—O—X-UVA-]-, or —[—CH$_2$—C(CH$_3$)C(O)—NH—X-UVA-]-, wherein X is a bond or an alkylene or alkyleneoxy group having from 1 to 10 (in some embodiments, 2 to 6 or 2 to 4) carbon atoms and optionally interrupted by one or more —O— groups and optionally substituted by a hydroxyl group, and wherein UVA includes any of the above embodiments of UVA groups. In the alkyleneoxy group, the oxygen is attached to the UVA group. The oligomer may include (e.g., at least 2, 3, 4, 5, 6, 7, 8, 9, 10, 15, or at least 20 up to 30, 35, 40, 45, 50, 100, 200, or up to 500 or more) of these repeating units, independently selected. The repeating unit can be derived from a substituted vinyl, substituted acrylate, or substituted methacrylate group. In some of these embodiments, each first divalent unit is independently represented by formula:

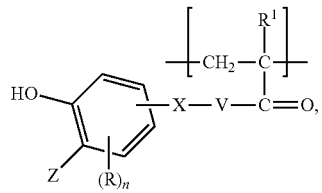

wherein R$^1$ is hydrogen or methyl, V is O or NH, X is a bond or X is alkylene or alkyleneoxy group having from 1 to 10 (in some embodiments, 2 to 6 or 2 to 4) carbon atoms and optionally interrupted by one or more —O— groups and optionally substituted by a hydroxyl group, R is alkyl (e.g., having from one to four carbon atoms), n is 0 or 1, and Z is a benzoyl group, a 4,6-bisphenyl[1,3,5]triazin-2-yl group, or a 2H-benzotriazol-2-yl group, wherein the benzoyl group, 4,6-bisphenyl[1,3,5]triazin-2yl group, and 2H-benzotriazol2-yl group is optionally substituted by one or more alkyl, aryl, alkoxy, hydroxyl, or halogen substituents, or a combination of these substituents. In some embodiments, the alkyl and/or alkoxy substituent independently has 1 to 4 or 1 to 2 carbon atoms. In some embodiments, each halogen substituent is independently a chloro, bromo, or iodo group. In some embodiments, each halogen substituent is a chloro group. The term "aryl" as used herein includes carbocyclic aromatic rings or ring systems, for example, having 1, 2, or 3 rings and optionally containing at least one heteroatom (e.g., O, S, or N) in the ring. Examples of aryl groups include phenyl, naphthyl, biphenyl, fluorenyl as well as furyl, thienyl, pyridyl, quinolinyl, isoquinolinyl, indolyl, isoindolyl, triazolyl, pyrrolyl, tetrazolyl, imidazolyl, pyrazolyl, oxazolyl, and thiazolyl. In the alkyleneoxy group, the oxygen is attached to the substituted benzene ring. In some embodiments, each V is O, and X is ethylene, propylene, butylene, ethyleneoxy, propyleneoxy, or butyleneoxy, with the oxygen attached to the substituted benzene ring. In some embodiments, n is 0. In some embodiments, R is methyl, ethyl, n-propyl, isopropyl, n-butyl, isobutyl, s-butyl, or t-butyl, and n is 1. In some embodiments, Z is an unsubstituted benzoyl group. In some embodiments, Z is 4,6-bis(2,4-dimethylphenyl)[1,3,5]triazin-2-yl; 4,6-bis(2,4-diethylphenyl)[1,3,5]triazin-2-yl; 4,6-bis(2, 4-dimethoxyphenyl)[1,3,5]triazin-2-yl; or 4,6-bis(2,4-diethoxyphenyl)[1,3,5]triazin-2-yl. In some embodiments, Z is 2H-benzotriazol-2-yl or 5-chloro-2H-benzotriazol-2-yl. In some embodiments, Z is 4,6-bisphenyl [1,3,5]triazin-2-yl. In some embodiments, at least some of the first divalent units in the ultraviolet light-absorbing oligomer comprise different Z groups.

In embodiments of the compositions disclosed herein in which the ultraviolet light-absorbing group is a triazine, at least some of the first divalent units may be represented by formula:

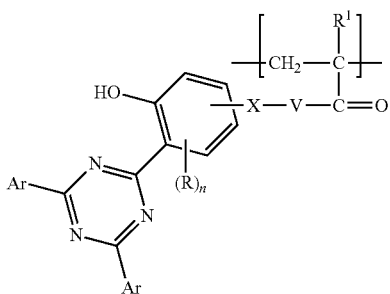

wherein R, $R^1$, X, and V are as described above in any of their embodiments, and wherein each Ar is a phenyl group optionally substituted by one or more alkyl, aryl, alkoxy, hydroxyl, or halogen substituents, or a combination of these substituents. In some embodiments, the alkyl and/or alkoxy substituent independently has 1 to 4 or 1 to 2 carbon atoms. In some embodiments, each halogen substituent is independently a chloro, bromo, or iodo group. In some embodiments, each halogen substituent is a chloro group. The aryl substituent is as defined above. In some embodiments, Ar is 2,4-dimethylphenyl; 2,4-diethylphenyl; 2,4-dimethoxyphenyl; or 2,4-diethoxyphenyl.

In embodiments of the compositions disclosed herein in which the ultraviolet light-absorbing group is a triazine, at least some of the first divalent unit may be represented by formula:

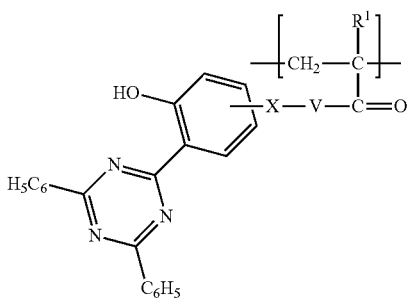

wherein $R^1$, X, and V are as described above in any of their embodiments.

Ultraviolet light-absorbing oligomers useful in the compositions according to the present disclosure comprise at least one (e.g., at least 2, 3, 4, 5, 6, 7, 8, 9, 10, 15, or at least 20 up to 30, 35, 40, 45, 50, 100, 200, 500, 1000, or up to 1500 or more) second divalent unit independently represented by formula:

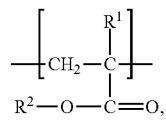

wherein each $R^1$ is independently hydrogen or methyl (in some embodiments hydrogen, in some embodiments, methyl), and wherein each $R^2$ is independently alkyl having from 1 to 22 carbon atoms (in some embodiments. In some embodiments, each $R^2$ in the second divalent units is independently alkyl having from 4 to 22, 4 to 20, 4 to 18, 4 to 16, 4 to 12, or 6 to 12 carbon atoms. In some of these embodiments, $R^2$ has 8 carbon atoms (e.g., $R^2$ is ethylhexyl or isooctyl).

In some embodiments, ultraviolet light-absorbing oligomers useful in the compositions according to the present disclosure comprise at least one (e.g., at least 2, 3, 4, 5, 6, 7, 8, 9, 10, 15, or at least 20 up to 30, 35, 40, 45, 50, 100, 200, 500, or up to 1000 or more) third divalent unit comprising a pendent carboxylic acid, hydroxyl, or aminocarbonyl group. The aminocarbonyl group can be aminocarbonyl (—C(O)—NH$_2$), alkylaminocarbonyl, dialkylaminocarbonyl, wherein the alkyl in the alkylaminocarbonyl or dialkylaminocarbonyl is optionally substituted by hydroxyl. It will be understood by a person skilled in the art that an aminocarbonyl group is also known as an amido group. When more than one third divalent unit is present, the third divalent units may be independently selected.

Oligomers according to the present disclosure can be prepared, for example, by polymerizing a mixture of components typically in the presence of an initiator. By the term "polymerizing" it is meant forming a polymer or oligomer that includes at least one identifiable structural element due to each of the components. Typically, preparing the ultraviolet light-absorbing oligomer includes combining components comprising at least a first monomer having an ultraviolet light-absorbing group, a second monomer, and optionally at least one third monomer, described below.

Suitable first monomers for some embodiments of the compositions disclosed herein are those that include benzophenone, benzotriazole, triazine, cinnamate, cyanoacrylate, dicyano ethylene, salicylate, oxanilide, or para-aminobenzoate groups. Examples of suitable first monomers include 2-(cyano-β,β-biphenylacryloyloxy)ethyl-1-methacrylate, 2-(α-cyano-β,β-biphenylacryloyloxy)ethyl-2-methacrylamide, N-(4-methacryloylphenol)-N'-(2-ethylphenyl)oxamide, vinyl 4-ethyl-α-cyano-β-phenylcinnamate, 2-hydroxy-4-(2-hydroxy-3-methacryloyloxypropoxy)benzophenone, 2-hydroxy-4-methacryloyloxybenzophenone, 2-hydroxy-4-(2-acryloyloxyethoxy)benzophenone, 2-hydroxy-4-(4-acryloyloxybutoxy)benzophenone, 2,2'-dihydroxy-4-(2-acryloyloxyethoxy)benzophenone, 2-hydroxy-4-(2-acryloyloxyethoxy)-4'-(2-hydroxyethoxy)benzophenone, 4-(allyloxy)-2-hydroxybenzophenone, 2-(2'-hydroxy-3'-methacrylamidomethyl-5'-octylphenyl)benzotriazole, 2-(2-hydroxy-5-vinylphenyl)-2-benzotriazole, 2-(2H-benzotriazol-2-yl)-4-methyl-6-(2-propenyl)phenol, 2-(2'-hydroxy-5'-methacryloyloxyethylphenyl)-2H-benzotriazole, 2-(2'-hydroxy-5'-methacryloyloxyethylphenyl)-5-chloro-2H-benzotriazole, 2-(2'-hydroxy-5'-methacryloyloxypropylphenyl)-2H-benzotriazole, 2-(2'-hydroxy-5'-methacryloyloxypropylphenyl)-5-chloro-2H-benzotriazole, 2-(2'-hydroxy-3'-tert-butyl-5'-methacryloyloxyethylphenyl)-2H-benzotriazole, 2-(2'-hydroxy-3'-tertbutyl-5'-methacryloyloxyethylphenyl)-5-chloro-2H-benzotriazole, 2,4-diphenyl-6-[2-hydroxy-4-(2-acryloyloxyethoxy)]-1,3,5-triazine, 2,4-bis(2-methylphenyl)-6-[2-hydroxy-4-(2-acryloyloxyethoxy)]-1,3,5-triazine, 2,4-bis(2-methoxyphenyl)-6-[2-hydroxy-4-(2-acryloyloxyethoxy)]-1,3,5-triazine, 2,4-bis(2-ethylphenyl)-6-[2-hydroxy-4-(2-acryloyloxyethoxy)]-1,3,5-triazine, 2,4-bis(2-ethoxyphenyl)-6-[2-hydroxy-4-(2-acryloyloxyethoxy)]-1,3,5-triazine, 2,4-diphenyl-6-[2-hydroxy-4-(2-methacryloyloxyethoxy)]-1,3,5-triazine, 2,4-bis(2-methylphenyl)-6-[2-hydroxy-4-(2-methacryloyloxyethoxy)]-1,3,5-triazine, 2,4-bis(2-methoxyphenyl)-6-[2-hydroxy-4-(2-methacryloyloxyethoxy)]-1,3,5-triazine, 2,4-bis(2-ethylphenyl)-6-[2-hydroxy-4-(2-methacryloyloxyethoxy)]-1,3,5-triazine, 2,4-bis(2-ethoxyphenyl)-6-[2-hydroxy-4-(2-methacryloyloxyethoxy)]-1,3,5-triazine, 2,4-bis(2,4-dimethoxyphenyl)-6-[2-hydroxy-4-(2-acryloyloxyethoxy)]-1,3,5-triazine, 2,4-bis(2,4-dimethylphenyl)-6-[2-hydroxy-4-(2-acryloyloxyethoxy)]-1,3,5-triazine, 2,4-bis(2,4-diethoxyphenyl)-6-[2-hydroxy-4-(2-acryloyloxyethoxy)]-1,3,5-triazine, 2,4-bis (2,4-diethylphenyl)-6-[2-hydroxy-4-(2-acryloyloxyethoxy)]-1,3,5-triazine, methacrylates of the foregoing acrylates and acrylates of the foregoing methacrylates. Combinations of these first monomers may be used to prepare the oligomer. In some embodiments, the first monomer includes a triazine, a benzophenone, or a benzotriazole group. In these embodiments, the first monomer can be any of the monomers including a triazine, benzophenone, or benzotriazole group listed above. In some embodiments of the composition according to the present disclosure, the first monomer includes a triazine group. In these embodiments, the first monomer can be any of the monomers including a triazine group listed above.

Many of these first monomers can be obtained commercially from a variety of chemical suppliers. Others can be prepared by treating a UVA having an available hydroxyl group (e.g., other than a phenolic hydroxyl group ortho to a triazine, benzoyl, or benzotriazole group) with (meth)acrylic acid or an equivalent thereof using conventional esterification methods. The term (meth)acrylic refers to both acrylic and methacrylic. In the case of a UVA having an available phenol group (e.g., other than a phenolic hydroxyl group ortho to a triazine, benzoyl, or benzotriazole group), the phenol group may be treated with ethylene carbonate or ethylene oxide to form a hydroxyethyl group that can then be treated with (meth)acrylic acid or an equivalent thereof using conventional esterification methods.

The components that are useful for preparing the oligomers disclosed herein include a second monomer. In some of these embodiments, the oligomer is prepared by including at least one compound represented by formula $R^2$—O—C(O)—C($R^1$)=$CH_2$ as the second monomer in the components to be polymerized. $R^1$ and $R^2$ are as defined above in any of their embodiments. Suitable second monomers of this formula include butyl acrylate, isoamyl acrylate, ethylhexyl acrylate, isooctyl acrylate, nonyl acrylate, dodecyl acrylate, hexadecyl methacrylate, octadecyl methacrylate, stearyl acrylate, behenyl methacrylate, acrylates of the foregoing methacrylates and methacrylates of the foregoing acrylates. Many of these second monomers are available, for example, from several chemical suppliers (e.g., Sigma-Aldrich Company, Milwaukee, Wis.; VWR International, West Chester, Pa.; Monomer-Polymer & Dajac Labs, Festerville, Pa.; Avocado Organics, Ward Hill, Mass.; and Ciba Specialty Chemicals, Basel, Switzerland) or may be synthesized by conventional methods. Some of these second monomers are available as single isomers (e.g., straight-chain isomer) of single compounds. Other are available, for example, as mixtures of isomers (e.g., straight-chain and branched isomers), mixtures of compounds (e.g., hexadecyl acrylate and octadecylacrylate), and combinations thereof.

Suitable third monomers in some embodiments of the oligomers disclosed herein include an acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,N-diethyl acrylamide, N-ethyl-N-dihydroxyethyl acrylamide, and methacrylamides of the foregoing acrylamides), a hydroxyalkyl (meth)acrylate (e.g., 2-hydroxyethyl acrylate or methacrylate, 3-hydroxypropyl acrylate or methacrylate, 4-hydroxybutyl acrylate or methacrylate, 8-hydroxyocyl acrylate or methacrylate, or 9-hydroxynonyl acrylate or methacrylate). N-vinyl pyrrolidone and N-vinyl caprolactam may also be useful in the preparation of the ultraviolet light-absorbing oligomers disclosed herein.

In some embodiments, the ultraviolet light-absorbing oligomer according to the present disclosure and/or useful in the compositions according to the present disclosure is represented by formula:

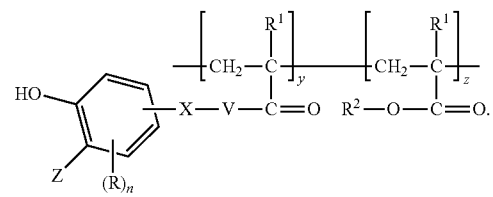

In this formula, X, V, Z, n, R, $R^1$, and $R^2$ are as defined above in any of their embodiments and y and z are any of the ranges described above in any of their embodiments. It should be understood that the representation of the order of the divalent units in this formula is for convenience only and not meant to specify that the oligomers are block copolymers. Random copolymers having first and second divalent units are also included in the representation. The representation can also include any of the third units described above in any order.

The polymerization reaction for making the oligomers useful in the compositions according to the present disclosure can be carried out in the presence of an added free-radical initiator. Free radical initiators such as those widely known and used in the art may be used to initiate polymerization of the components. Examples of suitable free-radical initiators include azo compounds (e.g., 2,2'-azobisisobutyronitrile (AIBN), 2,2'-azobis(2-methylbutyronitrile), or azo-2-cyanovaleric acid), hydroperoxides (e.g., cumene, tert-butyl or tert-amyl hydroperoxide), dialkyl peroxides (e.g., di-tert-butyl or dicumylperoxide), peroxyesters (e.g., tert-butyl perbenzoate or di-tert-butyl peroxyphthalate), and diacylperoxides (e.g., benzoyl peroxide or lauryl peroxide).

The free-radical initiator may also be a photoinitiator. Examples of useful photoinitiators include benzoin ethers (e.g., benzoin methyl ether or benzoin butyl ether); acetophenone derivatives (e.g., 2,2-dimethoxy-2-phenylacetophenone or 2,2-diethoxyacetophenone); 1-hydroxycyclohexyl phenyl ketone; and acylphosphine oxide derivatives and acylphosphonate derivatives (e.g., bis(2,4,6-trimethylbenzoyl)phenylphosphine oxide, diphenyl-2,4,6-trimethylbenzoylphosphine oxide, isopropoxyphenyl-2,4,6-trimethylbenzoylphosphine oxide, or dimethyl pivaloylphosphonate). Many photoinitiators are available, for examples, from BASF, Florham Park, N.J., under the trade designation "IRGACURE". The photoinitiator may be selected so that the wavelength of light required to initiate polymerization is not absorbed by the ultraviolet absorbing group.

In some embodiments, the polymerization reaction is carried out in solvent. The components may be present in the reaction medium at any suitable concentration, (e.g., from about 5 percent to about 80 percent by weight based on the total weight of the reaction mixture). Illustrative examples of suitable solvents include aliphatic and alicyclic hydrocarbons (e.g., hexane, heptane, cyclohexane), aromatic solvents (e.g., benzene, toluene, xylene), ethers (e.g., diethyl ether, glyme, diglyme, and diisopropyl ether), esters (e.g., ethyl acetate and butyl acetate), alcohols (e.g., ethanol and isopropyl alcohol), ketones (e.g., acetone, methyl ethyl ketone and methyl isobutyl ketone), halogenated solvents (e.g., methylchloroform, 1,1,2-trichloro-1,2,2-trifluoroethane, trichloroethylene, trifluorotoluene, and hydrofluoroethers available, for example, from 3M Company, St. Paul, Minn. under the trade designations "HFE-7100" and "HFE-7200"), and mixtures thereof.

Polymerization can be carried out at any temperature suitable for conducting an organic free-radical reaction. Temperature and solvent for a particular use can be selected by those skilled in the art based on considerations such as the solubility of reagents, temperature required for the use of a particular initiator, and desired molecular weight. While it is not practical to enumerate a particular temperature suitable for all initiators and all solvents, generally suitable temperatures are in a range from about 30° C. to about 200° C. (in some embodiments, from about 40° C. to about 100° C., or from about 50° C. to about 80° C.).

Free-radical polymerizations may be carried out in the presence of chain transfer agents. Typical chain transfer agents that may be used in the preparation compositions according to the present invention include hydroxyl-substituted mercaptans (e.g., 2-mercaptoethanol, 3-mercapto-2-butanol, 3-mercapto-2-propanol, 3-mercapto-1-propanol, and 3-mercapto-1,2-propanediol (i.e., thioglycerol)); poly(ethylene glycol)-substituted mercaptans; carboxy-substituted mercaptans (e.g., mercaptopropionic acid or mercaptoacetic acid); amino-substituted mercaptans (e.g., 2-mercaptoethylamine); difunctional mercaptans (e.g., di(2-mercaptoethyl)sulfide); and aliphatic mercaptans (e.g., octylmercaptan, dodecylmercaptan, and octadecylmercaptan).

Adjusting, for example, the concentration and activity of the initiator, the concentration of each of the reactive monomers, the temperature, the concentration of the chain transfer agent, and the solvent using techniques known in the art can control the molecular weight of the oligomer.

The weight ratio of the first divalent units, second divalent units, and third divalent units in the oligomers disclosed herein in any of their embodiments may vary. For example, the first divalent units may be present in the ultraviolet light-absorbing oligomer in a range from 5 to 50 (in some embodiments, 10 to 40 or 10 to 30) percent, based on the total weight of the oligomer. The second divalent units may be present in a range from 5 to 95 percent, based on the total weight of the oligomer. In some embodiments, the second divalent unit is present in the oligomer in an amount of up to 90, 80, 75, or 70 percent by weight, based on the total weight of the oligomer. Third divalent units may be present in a range from 1 to 15, 1 to 10, or 1 to 5 percent by weight, based on the total weight of the oligomer. Or there may be no third divalent units in the ultraviolet light-absorbing oligomer. In some embodiments, the oligomer comprises at least one (e.g., at least 2, 3, 4, 5, 6, 7, 8, 9, 10, 15, or at least 20 up to 30, 35, 40, 45, 50, 100, 200, 500, 1000, or up to 1500 or more) independently second divalent units and at least one (e.g., at least 2, 3, 4, 5, 6, 7, 8, 9, 10, 15, or at least 20 up to 30, 35, 40, 45, 50, 100, 200, or up to 500 or more) independently selected first divalent units.

The composition according to the present disclosure includes a blend of a pressure sensitive adhesive and the ultraviolet light-absorbing oligomer(s). By "blend" it should be understood that the pressure sensitive adhesive and the ultraviolet light-absorbing oligomer(s) are distinct components. They are generally not covalently bonded to each other. Ultraviolet light-absorbing monomers grafted onto a PSA do not constitute a blend of the PSA and the oligomer(s) as disclosed herein.

Ultraviolet light-absorbing oligomers as described above in any of their embodiments are incorporated into pressure sensitive adhesives compositions. PSAs are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power.

One method useful for identifying pressure sensitive adhesives is the Dahlquist criterion. This criterion defines a pressure sensitive adhesive as an adhesive having a 1 second creep compliance of greater than $1\times10^{-6}$ $cm^2/dyne$ as described in "Handbook of Pressure Sensitive Adhesive Technology", Donatas Satas (Ed.), 2nd Edition, p. 172, Van Nostrand Reinhold, New York, N.Y., 1989. Alternatively, since modulus is, to a first approximation, the inverse of creep compliance, pressure sensitive adhesives may be defined as adhesives having a storage modulus of less than about $1\times10^6$ $dynes/cm^2$.

Examples of useful classes PSAs that may include the ultraviolet light-absorbing oligomers according to the present disclosure include acrylic, silicone, polyisobutylene, urea, natural rubber, synthetic rubber such as an ABA triblock copolymer of styrene or substituted styrene as the A blocks and polybutadiene, hydrogenated polybutadiene, polyisoprene, hydrogenated polyisoprene, or a combination of thereof as the B block, and combinations of these classes. Some useful commercially available PSAs into which the ultraviolet light-absorbing oligomer according to the present disclosure can be incorporated include UV curable PSAs such as those available from Adhesive Research, Inc., Glen Rock, Pa., under the trade designations "ARclear 90453" and "ARclear 90537" and acrylic optically clear PSAs available, for example, from 3M Company, St. Paul, Minn., under the trade designations "OPTICALLY CLEAR LAMINATING ADHESIVE 8171", "OPTICALLY CLEAR LAMINATING ADHESIVE 8172", and "OPTICALLY CLEAR LAMINATING ADHESIVE 8172P".

In some embodiments, the PSA composition into which the ultraviolet light-absorbing oligomer according to the present disclosure can be incorporated does not flow and has sufficient barrier properties to provide slow or minimal infiltration of oxygen and moisture through the adhesive bond line. Also, the PSA composition may be generally transmissive to visible and infrared light such that it does not interfere with transmission of visible light, for example, through a window film or absorption of visible light, for example, by photovoltaic cells. The PSAs may have an average transmission over the visible portion of the spectrum of at least about 75% (in some embodiments at least about 80, 85, 90, 92, 95, 97, or 98%) measured along the normal axis. In some embodiments, the PSA has an average transmission over a range of 400 nm to 1400 nm of at least about 75% (in some embodiments at least about 80, 85, 90, 92, 95, 97, or 98%) measured along the normal axis.

In some embodiments, useful PSA compositions disclosed herein have a modulus (tensile modulus) up to 50,000 psi ($3.4 \times 10^8$ Pa). The tensile modulus can be measured, for example, by a tensile testing instrument such as a testing system available from Instron, Norwood, Mass., under the trade designation "INSTRON 5900". In some embodiments, the tensile modulus of the PSA is up to 40,000, 30,000, 20,000, or 10,000 psi ($2.8 \times 10^8$ Pa, $2.1 \times 10^8$ Pa, $1.4 \times 10^8$ Pa, or $6.9 \times 10^8$ Pa).

In some embodiments, PSAs compositions that include the ultraviolet light-absorbing oligomer according to the present disclosure are acrylic PSAs. As used herein, the term "acrylic" or "acrylate" includes compounds having at least one of acrylic or methacrylic groups. Useful acrylic PSAs can be made, for example, by combining at least two different monomers (second and third monomers as described above). Examples of suitable second monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, isononyl acrylate, and methacrylates of the foregoing acrylates. Examples of suitable third monomers include a (meth) acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,N-diethyl acrylamide, N-ethyl-N-dihydroxyethyl acrylamide, and methacrylamides of the foregoing acrylamides), a (meth)acrylate (e.g., 2-hydroxyethyl acrylate or methacrylate, cyclohexyl acrylate, t-butyl acrylate, isobornyl acrylate, and methacrylates of the foregoing acrylates), N-vinyl pyrrolidone, N-vinyl caprolactam, an alpha-olefin, a vinyl ether, an allyl ether, a styrenic monomer, or a maleate.

In some embodiments, the pressure sensitive adhesive is an acrylic pressure sensitive adhesive comprising the second divalent unit, and wherein for at least some of the second divalent units in the pressure sensitive adhesive $R^2$ is alkyl having the same number of carbon atoms as at least some of the second divalent units in the ultraviolet light-absorbing oligomer. For example, for a PSA based on isooctyl acrylate, it can be useful for the ultraviolet light-absorbing oligomer to include second divalent units in which $R^2$ is alkyl having 8 carbon atoms. Matching the $R^2$ groups in the second divalent units of the PSA and the ultraviolet light-absorbing oligomer can improve compatibility between the PSA and the oligomer, resulting in higher light transmission and clarity in the PSA composition. Although using methyl methacrylate copolymers with the first monomers described above to make oligomers for incorporating into PSAs has been described (see, JP2000123621, published Apr. 28, 2000), we have found that these type of oligomers result in lower clarity in PSA compositions than when the ultraviolet light-absorbing oligomer includes divalent units that match those in the PSA (see Table 1 in the Examples, below). Further compatibility improvements may be achieved when both the pressure sensitive adhesive and the ultraviolet light-absorbing oligomer comprise the same third divalent unit (made from the same third monomers as described above).

Acrylic PSAs may also be made by including crosslinking agents in the formulation. Examples of cross-linking agents include copolymerizable polyfunctional ethylenically unsaturated monomers (e.g., 1,6-hexanediol diacrylate, trimethylolpropane triacrylate, pentaerythritol tetraacrylate, and 1,2-ethylene glycol diacrylate); ethylenically unsaturated compounds which in the excited state are capable of abstracting hydrogen (e.g., acrylated benzophenones such as described in U.S. Pat. No. 4,737,559 (Kellen et al.), p-acryloxy-benzophenone, which is available from Sartomer Company, Exton, Pa., monomers described in U.S. Pat. No. 5,073,611 (Rehmer et al.) including p-N-(methacryloyl-4-oxapentamethylene)-carbamoyloxybenzophenone, N-(benzoyl-p-phenylene)-N'-(methacryloxymethylene)-carbodiimide, and p-acryloxy-benzophenone); nonionic crosslinking agents which are essentially free of olefinic unsaturation and is capable of reacting with carboxylic acid groups, for example, in the third monomer described above (e.g., 1,4-bis(ethyleneiminocarbonylamino)benzene; 4,4-bis(ethyleneiminocarbonylamino)diphenylmethane; 1,8-bis(ethyleneiminocarbonylamino)octane; 1,4-tolylene diisocyanate; 1,6-hexamethylene diisocyanate, N,N'-bis-1,2-propyleneisophthalamide, diepoxides, dianhydrides, bis(amides), and bis(imides)); and nonionic crosslinking agents which are essentially free of olefinic unsaturation, are noncopolymerizable with the first and second monomers, and, in the excited state, are capable of abstracting hydrogen (e.g., 2,4-bis(trichloromethyl)-6-(4-methoxy)phenyl)-s-triazine; 2,4-bis(trichloromethyl)-6-(3,4-dimethoxy)phenyl)-s-triazine; 2,4-bis(trichloromethyl)-6-(3,4,5-trimethoxy)phenyl)-s-triazine; 2,4-bis(trichloromethyl)-6-(2,4-dimethoxy)phenyl)-s-triazine; 2,4-bis(trichloromethyl)-6-(3-methoxy) phenyl)-s-triazine as described in U.S. Pat. No. 4,330,590 (Vesley); 2,4-bis(trichloromethyl)-6-naphthenyl-s-triazine and 2,4-bis(trichloromethyl)-6-(4-methoxy)naphthenyl-s-triazine as described in U.S. Pat. No. 4,329,384 (Vesley)).

Typically, the second monomer is used in an amount of 80-100 parts by weight (pbw) based on a total weight of 100 parts of copolymer, and the third monomer is used in an amount of 0-20 pbw based on a total weight of 100 parts of copolymer. The crosslinking agent can be used in an amount of 0.005 to 2 weight percent based on the combined weight of the monomers, for example from about 0.01 to about 0.5 percent by weight or from about 0.05 to 0.15 percent by weight.

The acrylic PSAs useful for practicing the present disclosure can be prepared, for example, in solvent or by a solvent free, bulk, free-radical polymerization process (e.g., using heat, electron-beam radiation, or ultraviolet radiation). Such polymerizations are typically facilitated by a polymerization initiator (e.g., a photoinitiator or a thermal initiator). Examples of suitable polymerization initiators include an of those described above for the preparation of the ultraviolet light-absorbing oligomer. The polymerization initiator is used in an amount effective to facilitate polymerization of the monomers (e.g., 0.1 part to about 5.0 parts or 0.2 part to about 1.0 part by weight, based on 100 parts of the total monomer content).

If a photocrosslinking agent is used, the coated adhesive can be exposed to ultraviolet radiation having a wavelength of about 250 nm to about 400 nm. The radiant energy in this range of wavelength required to crosslink the adhesive is about 100 millijoules/cm$^2$ to about 1,500 millijoules/cm2, or more specifically, about 200 millijoules/cm$^2$ to about 800 millijoules/cm$^2$.

A useful solvent-free polymerization method is disclosed in U.S. Pat. No. 4,379,201 (Heilmann et al.). Initially, a mixture of second and third monomers can be polymerized with a portion of a photoinitiator by exposing the mixture to UV radiation in an inert environment for a time sufficient to form a coatable base syrup, and subsequently adding a crosslinking agent and the remainder of the photoinitiator. This final syrup containing a crosslinking agent (e.g., which may have a Brookfield viscosity of about 100 centipoise to about 6000 centipoise at 23° C., as measured with a No. 4 LTV spindle, at 60 revolutions per minute) can then be coated onto a substrate, for example, a polymeric film substrate. Once the syrup is coated onto the substrate, for example, the polymeric film substrate, further polymerization and crosslinking can be carried out in an inert environment (e.g., nitrogen, carbon dioxide, helium, and argon, which exclude oxygen). A sufficiently inert atmosphere can be achieved by covering a layer of the photoactive syrup with a polymeric film, such as silicone-treated PET film, that is transparent to UV radiation or e-beam and irradiating through the film in air.

PSAs generally include high molecular weight polymers. In some embodiments, the acrylic polymer in the pressure sensitive adhesive in the composition according to the present disclosure has a number average molecular weight of at least 300,000 grams per mole. Number average molecular weights lower than 300,000 grams per mole may produce PSAs with low durability. In some embodiments, the number average molecular weight of the PSA is in the range from 300,000 to 3 million, 400,000 to 2 million, 500,000 to 2 million, or 300,000 to 1 million grams per mole. Accordingly, in some embodiments, the ultraviolet light-absorbing oligomer has a number average molecular weight of up to one half the number average molecular weight of the pressure sensitive adhesive. In some embodiments, the ultraviolet light-absorbing oligomer has a number average molecular weight of up to one-third, one-fifth, or one-tenth the number average molecular weight of the pressure sensitive adhesive.

It can be useful to have a mixture of different ultraviolet light-absorbing oligomers in the compositions according to the present disclosure. In some embodiments, the composition comprises at least two different ultraviolet light-absorbing oligomers in the blend, each ultraviolet light-absorbing oligomer independently comprising the first divalent unit, the second divalent unit, and optionally the third divalent unit. Each ultraviolet light-absorbing oligomer may independently comprise a triazine, a benzophenone, or a benzotriazole. It may be useful for two different ultraviolet light-absorbing oligomers to have two different types of pendent ultraviolet absorbing group. In these embodiments, the first divalent units in the ultraviolet light-absorbing oligomer and in the second, different ultraviolet light-absorbing oligomer comprise different Z groups. In any of these embodiments, the second, different ultraviolet-light absorbing oligomer can comprise at least one (e.g., at least 2, 3, 4, 5, 6, 7, 8, 9, 10, 15, or at least 20 up to 30, 35, 40, 45, 50, 100, 200, 500, 1000, or up to 1500 or more) second divalent unit, at least one (e.g., at least 2, 3, 4, 5, 6, 7, 8, 9, 10, 15, or at least 20 up to 30, 35, 40, 45, 50, 100, 200, or up to 500 or more) first divalent unit, and optionally at least one (e.g., at least 2, 3, 4, 5, 6, 7, 8, 9, 10, 15, or at least 20 up to 30, 35, 40, 45, 50, 100, 200, 500, or up to 1000 or more) third divalent unit. The first, second, and third divalent units may be as described in any of the embodiments described above for the ultraviolet light-absorbing oligomer. The mixture of two different ultraviolet-light absorbing oligomers may be useful to improve compatibility in some cases.

Other stabilizers may be added to the compositions according to the present disclosure to improve resistance to UV light. Examples of these include hindered amine light stabilizers (HALS) and anti-oxidants. Some suitable HALS include a tetramethylpiperidine group, in which the nitrogen atoms on the piperidine may be unsubstituted or substituted by alkyl or acyl. Suitable HALS include decanedioic acid, bis (2,2,6,6-tetramethyl-1-(octyloxy)-4-piperidinyl)ester, bis(2,2,6,6-tetramethyl-4-piperidyl)sebacate, 8-acetyl-3-dodecyl-7,7,9,9-tetramethyl-1,3,8-triazaspiro(4,5)-decane-2,5-dione, bis(2,2,6,6-tetramethyl-4-hydroxypiperidine succinate), and bis(N-methyl-2,2,6,6-tetramethyl-4-piperidyl) secacate. Suitable HALS include those available, for example, from BASF under the trade designations "CHIMASSORB". Exemplary anti-oxidants include those obtained under the trade designations "IRGAFOS 126", "IRGANOX 1010" and "ULTRANOX 626", available from BASF, Florham Park, N.J. These stabilizers, if present, can be included in the compositions according to the present disclosure in any effective amount, typically up to 5, 2, to 1 percent by weight based on the total weight of the composition and typically at least 0.1, 0.2, or 0.3 percent by weight. Calcite may also be a useful additive in some compositions, for example, to protect against corrosion of processing equipment not made of corrosion resistant steel.

In some embodiments of the composition or methods of making the composition or the film, the composition is essentially free of volatile organic solvent. Volatile organic solvents are typically those have a boiling point of up to 150° C. at atmospheric pressure. Examples of these include esters, ketones, and toluene. "Essentially free of volatile organic solvent" can mean that volatile organic solvent may be present (e.g., from a previous synthetic step or in a commercially available monomer) in an amount of up to 2.5 (in some embodiments, up to 2, 1, 0.5, 0.1, 0.05, or 0.01) percent by weight, based on the total weight of the composition. Advantageously, compositions disclosed herein and their films can be made without the expensive manufacturing step of removing organic solvent.

The compositions according to the present disclosure can include the ultraviolet light-absorbing oligomer and optionally the second ultraviolet light-absorbing oligomer in a range of useful amounts. For example, the ultraviolet light-absorbing oligomer may be present in the composition at up to about 25 percent by weight, based on the total weight of the composition. When two or more different ultraviolet light-absorbing oligomers are present, the two or more are present in the composition in an amount up to 25 percent combined weight, based on the total weight of the composition. Useful amounts of the ultraviolet light-absorbing oligomer(s) may be in a range from 1 to 25, 2 to 20, 3 to 15, or 4 to 10 percent by weight, based on the total weight of the composition. Useful amounts of the ultraviolet absorbing group (in other words, active UVA) may be in a range from 0.5 to 15, 0.5 to 10, 1 to 7.5, or 2 to 5 percent by weight, based on the total weight of the composition.

In some embodiments, compositions according to the present disclosure are transmissive to both visible and infrared light. The term "transmissive to visible and infrared light" as used herein can mean having an average transmission over the visible and infrared portion of the spectrum of at least about 75% (in some embodiments at least about 80, 85, or 90, 92, 95, 97, or 98%) measured along the normal axis. In some embodiments, the composition has an average transmission over a range of 400 nm to 1400 nm of at least about 75% (in some embodiments at least 80, 85, 90, 92, 95, 97, or 98%) measured along the normal axis.

Compositions according to the present disclosure may be useful for a variety of outdoor applications. For example, the compositions according to the present disclosure may be useful, for example, as a PSA layer on traffic or other signs, other graphic films, anti-graffiti films, automotive exteriors, roofing materials or other architectural films, barrier films, or window films.

Compositions according to the present disclosure are useful, for example, in solar devices. In some embodiments, the composition (e.g., in any embodiment in the form of a film) is disposed on, above, or around a photovoltaic cell. Accordingly, the present disclosure provides a photovoltaic device including the composition disclosed herein in which the composition is used as a PSA in a photovoltaic device. Photovoltaic devices include photovoltaic cells that have been developed with a variety of materials each having a unique absorption spectrum that converts solar energy into electricity. Each type of semiconductor material has a characteristic band gap energy which causes it to absorb light most efficiently at certain wavelengths of light, or more precisely, to absorb electromagnetic radiation over a portion of the solar spectrum. The compositions according to the present disclosure typically do not interfere with absorption of visible and infrared light, for example, by photovoltaic cells. In some embodiments, the composition has an average transmission over a range wavelengths of light that are useful to a photovoltaic cell of at least about 75% (in some embodiments at least about 80, 85, 90, 92, 95, 97, or 98%) measured along the normal axis. Examples of materials used to make solar cells and their solar light absorption band-edge wavelengths include: crystalline silicon single junction (about 400 nm to about 1150 nm), amorphous silicon single junction (about 300 nm to about 720 nm), ribbon silicon (about 350 nm to about 1150 nm), CIS (Copper Indium Selenide) (about 400 nm to about 1300 nm), CIGS (Copper Indium Gallium di-Selenide) (about 350 nm to about 1100 nm), CdTe (about 400 nm to about 895 nm), GaAs multi-junction (about 350 nm to about 1750 nm). The shorter wavelength left absorption band edge of these semiconductor materials is typically between 300 nm and 400 nm. Organic photovoltaic cells may also be useful. One skilled in the art understands that new materials are being developed for more efficient solar cells having their own unique longer wavelength absorption band-edge. In some embodiments, the photovoltaic device including the composition according to the present disclosure includes a CIGS cell. In some embodiments, the photovoltaic device to which the assembly is applied comprises a flexible film substrate.

A composition according to the present disclosure can be used as a PSA in a barrier stack (see, e.g., U.S. Pat. Appl. Pub. No. 2012/0227809 (Bharti et al. and U.S. Pat. Appl. Pub. No. 2012/0003451 (Weigel et al.), incorporated herein by reference.

In some embodiments, the present disclosure provides an assembly including a first polymeric film substrate having a first surface and a second surface opposite the first surface, a barrier film disposed on the first surface of the first polymeric film, a pressure sensitive adhesive layer having a first surface and a second surface opposite the first surface, wherein the first surface of the pressure sensitive adhesive is disposed on the barrier film opposite the first polymeric film substrate; and a second polymeric film substrate disposed on the second surface of the pressure sensitive adhesive layer. The pressure sensitive adhesive can be as described in any of the aforementioned embodiments and includes at least one ultraviolet light-absorbing oligomer as described in any of the aforementioned embodiments.

The term "barrier film" refers to films that provide a barrier to at least one of oxygen or water. Barrier films are typically selected such that they have oxygen and water transmission rates at a specified level as required by the application. In some embodiments, the barrier film according to the present disclosure and/or made according to the method of the present disclosure has a water vapor transmission rate (WVTR) less than about 0.005 g/m$^2$/day at 38° C. and 100% relative humidity; in some embodiments, less than about 0.0005 g/m$^2$/day at 38° C. and 100% relative humidity; and in some embodiments, less than about 0.00005 g/m$^2$/day at 38° C. and 100% relative humidity. In some embodiments, the barrier film has a WVTR of less than about 0.05, 0.005, 0.0005, or 0.00005 g/m$^2$/day at 50° C. and 100% relative humidity or even less than about 0.005, 0.0005, 0.00005 g/m$^2$/day at 85° C. and 100% relative humidity. In some embodiments, the barrier film has an oxygen transmission rate of less than about 0.005 g/m$^2$/day at 23° C. and 90% relative humidity; in some embodiments, less than about 0.0005 g/m$^2$/day at 23° C. and 90% relative humidity; and in some embodiments, less than about 0.00005 g/m$^2$/day at 23° C. and 90% relative humidity.

In some embodiments of the assembly disclosed herein, the barrier film comprises at least first and second polymer layers separated by an inorganic barrier layer. In some embodiments, an inorganic layer, which may be an oxide layer, can be applied over the second polymer layer. In some embodiments, the barrier film comprises a plurality of alternating layers of the oxide layer and the second polymer layer on the first polymer layer. The oxide layer and second polymer layer together form a "dyad", and in some embodiments, the barrier film can include more than one dyad. Each of the oxide layers and/or second polymer layers in the multilayer barrier film including more than one dyad can be the same or different. An optional inorganic layer, which may be an oxide layer, can be applied over the plurality of alternating layers or dyads. In some embodiments, inorganic layers comprise at least one of silicon aluminum oxide or indium tin oxide.

The first and second polymer layers can include any polymer suitable for deposition in a thin film. In some embodiments, the first and second polymer layer can be formed from various precursors, for example, acrylate or methacrylate monomers and/or oligomers that include acrylates or methacrylates. In some embodiments of the barrier film and the method disclosed herein, at least one of the first or second polymer layer precursor comprises a methacrylate or acrylate monomer. Examples of useful methacrylate and acrylate precursors include urethane acrylates, isobornyl acrylate, isobornyl methacrylate, dipentaerythritol pentaacrylates, epoxy acrylates, epoxy acrylates blended with styrene, di-trimethylolpropane tetraacrylates, diethylene glycol diacrylates, 1,3-butylene glycol diacrylate, pentaacrylate esters, pentaerythritol tetraacrylates, pentaerythritol triacrylates, ethoxylated (3) trimethylolpropane triacrylates, ethoxylated (3) trimethylolpropane triacrylates, alkoxylated trifunctional acrylate esters, dipropylene glycol diacrylates, neopentyl glycol diacrylates, ethoxylated (4) bisphenol A dimethacrylates, cyclohexane dimethanol diacrylate esters, isobornyl methacrylate, cyclic diacrylates and tris (2-hydroxy ethyl) isocyanurate triacrylate, acrylates of the foregoing methacrylates and methacrylates of the foregoing acrylates. Further examples of useful acrylate or methacrylate precursors include trimethylolpropane triacrylate, trimethylolpropane diacrylate, hexanediol diacrylate, ethoxyethyl acrylate, phenoxyethyl acrylate, cyanoethyl (mono)acrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2,2,2-trifluoromethyl acrylate, and methacrylates of any of these acrylates.

The first and second polymer layers can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the substrate.

The monomer or oligomer can also be applied to the substrate using conventional coating methods such as roll coating (e.g., gravure roll coating) or spray coating (e.g., electrostatic spray coating), then crosslinked as set out above. The first and second polymer layers can also be formed by applying a layer containing an oligomer or polymer in solvent and drying the thus-applied layer to remove the solvent. Chemical Vapor Deposition (CVD) may also be employed in some cases.

In some embodiments, at least one of the first or second polymer layers comprises a polymerized (e.g., cross-linked) acrylate or methacrylate. In some of these embodiments, the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, pentaerythritol tetraacrylate, propoxylated (3) glyceryl diacrylate, propoxylated (5,5) glyceryl diacrylate, propoxylated (3) trimethylolpropane diacrylate, propoxylated (6) trimethylolpropane diacrylate), trimethylolpropane diacrylate, trimethylolpropane triacrylate, di-trimethylolpropane tetraacrylate, dipentaerythritol pentaacrylate, or combinations thereof.

Useful methods for flash evaporation and vapor deposition followed by crosslinking in situ, can be found, for example, in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

In some embodiments, amino-functional silanes can be added to at least one of the first or second polymer layers. Amino-functional silanes have been added to polymer layers to effectively improve adhesion between inorganic oxide layers and polymer layers in a multi-layer barrier film. Cyclic aza silanes have shown improved adhesion even up to 250 hours of aging at 85° C. and 85% relative humidity. See U.S. Pat. App. Pub. Nos. 2012-0003451 (Weigel et al.) and 2012-0003484 (Roehrig et al.), each incorporated by reference in its entirety herein. Secondary or tertiary amino-functional silane having at least two silane groups maintain adhesion and resist delamination after aging for 1000 hours at 85° C. and 85% relative humidity. See Int. Appl. Pub. No. WO2014/025983 (Spagnola et al.), incorporated by reference in its entirety herein. In some embodiments in which at least one of the first or second polymer layers comprises a polymerized (e.g., cross-linked) acrylate or methacrylate, the siloxane reaction product includes an amide bond that is formed from reaction between the amino group of the secondary or tertiary amino-functional silane and the acrylate or methacrylate.

The oxide layer typically comprises at least one inorganic oxide. Suitable inorganic materials that may also be included are nitrides, carbides or borides of different atomic elements. Examples of inorganic materials included in the oxide layer comprise oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof. Examples of suitable inorganic materials include silicon oxides such as silica, aluminum oxides such as alumina, titanium oxides such as titania, indium oxides, tin oxides, indium tin oxide ("ITO"), tantalum oxide, zirconium oxide, niobium oxide, aluminum nitride, silicon nitride, boron nitride, aluminum oxynitride, silicon oxynitride, boron oxynitride, zirconium oxyboride, titanium oxyboride, and combinations thereof. ITO is an example of a special class of ceramic materials that can become electrically conducting with the proper selection of the relative proportions of each elemental constituent. In some embodiments, the oxide layer comprises at least one of silicon aluminum oxide or ITO. While the barrier films disclosed herein include at least one oxide layer between first and second polymer layers, in some embodiments, an inorganic layer, for example, an inorganic oxide layer, may be applied to the uppermost second polymer layer.

The oxide layer can be formed using techniques employed in the film metalizing art such as sputtering (e.g., cathode or planar magnetron sputtering), evaporation (e.g., resistive or electron beam evaporation), chemical vapor deposition, plating and the like. In some embodiments, the oxide layer is formed using sputtering, e.g., reactive sputtering. Enhanced barrier properties have been observed when the oxide layer is formed by a high energy deposition technique such as sputtering compared to lower energy techniques such as conventional chemical vapor deposition processes. Without being bound by theory, it is believed that the enhanced properties are due to the film-forming species arriving at the substrate with greater kinetic energy as occurs in sputtering, leading to a lower void fraction as a result of compaction.

In some embodiments, the sputter deposition process can use dual targets powered by an alternating current (AC)

power supply in the presence of a gaseous atmosphere having inert and reactive gases, for example argon and oxygen, respectively. The AC power supply alternates the polarity to each of the dual targets such that for half of the AC cycle one target is the cathode and the other target is the anode. On the next cycle the polarity switches between the dual targets. This switching occurs at a set frequency, for example about 40 kHz, although other frequencies can be used. Oxygen that is introduced into the process forms oxide layers on both the substrate receiving the inorganic composition, and also on the surface of the target. The dielectric oxides can become charged during sputtering, thereby disrupting the sputter deposition process. Polarity switching can neutralize the surface material being sputtered from the targets, and can provide uniformity and better control of the deposited material.

In some embodiments, the sputter deposition process can use targets powered by direct current (DC) power supplies in the presence of a gaseous atmosphere having inert and reactive gasses, for example argon and oxygen, respectively. The DC power supplies supply power (e.g. pulsed power) to each cathode target independent of the other power supplies. In this aspect, each individual cathode target and the corresponding material can be sputtered at differing levels of power, providing additional control of composition through the layer thickness. The pulsing aspect of the DC power supplies is similar to the frequency aspect in AC sputtering, allowing control of high rate sputtering in the presence of reactive gas species such as oxygen. Pulsing DC power supplies allow control of polarity switching, can neutralize the surface material being sputtered from the targets, and can provide uniformity and better control of the deposited material.

The barrier film can be fabricated by deposition of the various layers onto the substrate, in a roll-to-roll vacuum chamber similar to the system described in U.S. Pat. No. 5,440,446 (Shaw et al.) and U.S. Pat. No. 7,018,713 (Padiyath, et al.), each incorporated by reference in its entirety herein. The deposition of the layers can be in-line, and in a single pass through the system. In some cases, the barrier film can pass through the system several times, to form a multilayer barrier film having several dyads.

Examples of useful first polymeric film substrates onto which barrier films are disposed include thermoplastic polymeric films including, for example, polyesters, polyacrylates (e.g., polymethyl methacrylate), polycarbonates, polypropylenes, high or low density polyethylenes, polysulfones, polyether sulfones, polyurethanes, polyamides, polyvinyl butyral, polyvinyl chloride, fluoropolymers (e.g., polyvinylidene difluoride and polytetrafluoroethylene), polyethylene sulfide, olefinic copolymers such copolymers of ethylene and norbornene (e.g., available as "TOPAS COC" from Topas Advanced Polymers of Florence, Ky.), and thermoset films such as epoxies, cellulose derivatives, polyimide, polyimide benzoxazole, and polybenzoxazole.

In some embodiments, the first polymeric film substrate comprises at least one of polyethylene terephthalate, polyethylene naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

In some embodiments, the first polymeric film substrate comprises at least one of polyethylene terephthalate (PET), polyethylene napthalate (PEN), heat stabilized PET, heat stabilized PEN, polyoxymethylene, polyvinylnaphthalene, polyetheretherketone, fluoropolymer, polycarbonate, polymethylmethacrylate, poly α-methyl styrene, polysulfone, polyphenylene oxide, polyetherimide, polyethersulfone, polyamideimide, polyimide, or polyphthalamide. In some embodiments, the substrate includes PET.

Heat-stabilization of the substrate may be carried out, for example, using heat setting, annealing under tension, or other techniques that will discourage shrinkage up to at least the heat stabilization temperature when the polymeric film is not constrained.

In some embodiments, the first polymeric film substrate is a multilayer optical film ("MOF"), such as those described in U.S. Pat. App. Pub. No. 2012-0003451 (Weigel et al.).

The substrate may have a variety of thicknesses, for example, about 0.01 millimeters (mm) to about 1 mm. The substrate may however be considerably thicker, for example, when a self-supporting article is desired. Such articles can conveniently also be made by laminating or otherwise joining a disclosed film made using a flexible substrate to a thicker, inflexible, or less flexible supplemental support.

In some embodiments, the smoothness and continuity of the first polymer layer (and also each oxide layer and second polymer layer) and its adhesion to the underlying substrate or layer may be enhanced by appropriate pretreatment to the first polymeric film substrate. Examples of a suitable pretreatment regimen include an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric (or inorganic) layer. Plasma pretreatment can be particularly useful.

In some embodiments, a separate tie layer which may have a different composition than the first polymer layer may also be used atop the substrate or an underlying layer to improve adhesion. The adhesion promotion layer can be, for example, a separate polymeric layer or a metal-containing layer such as a layer of metal, metal oxide, metal nitride or metal oxynitride. The tie layer may have a thickness of a few nanometers (nm) (e.g., 1 or 2 nm) to about 50 nm, and can be thicker if desired.

The desired chemical composition and thickness of the first polymer layer will depend in part on the nature and surface topography of the substrate. The thickness typically is sufficient to provide a smooth, defect-free surface to which the subsequent oxide layer can be applied. For example, the first polymer layer may have a thickness of a few nm (e.g., 2 or 3 nm) to about 5 micrometers, and can be thicker if desired.

A major surface of the barrier film is adhered to second polymeric film substrate with a pressure sensitive adhesive according to the present disclosure. The second polymeric film substrate can form the topsheet, for example, in a barrier assembly for a photovoltaic device. Useful materials that can form the top sheet include polyesters, polycarbonates, polyethers, polyimides, polyolefins, fluoropolymers, and combinations thereof.

In embodiments wherein the barrier assembly according to the present disclosure is used, for example, for encapsulating solar devices, it is typically desirable for the top sheet to be resistant to degradation by ultraviolet (UV) light and weatherable. Photo-oxidative degradation caused by UV light (e.g., in a range from 280 to 400 nm) may result in color change and deterioration of optical and mechanical properties of polymeric films. The top sheets described herein can provide, for example, a durable, weatherable topcoat for a photovoltaic device. The substrates are generally abrasion and impact resistant and can prevent degradation of, for example, photovoltaic devices when they are exposed to outdoor elements.

A variety of stabilizers may be added to the top sheet to improve its resistance to UV light. Examples of such stabilizers include at least one of ultraviolet absorbers (UVA) (e.g., red shifted UV absorbers), hindered amine light stabilizers (HALS), or anti-oxidants. These additives are described in further detail below. In some embodiments, the phrase "resistant to degradation by ultraviolet light" means that the top sheet includes at least one ultraviolet absorber or hindered amine light stabilizer. In some embodiments, the phrase "resistant to degradation by ultraviolet light" means that the top sheet at least one of reflects or absorbs at least 50 percent of incident ultraviolet light over at least a 30 nanometer range in a wavelength range from at least 300 nanometers to 400 nanometers. In some of these embodiments, the top sheet need not include UVA or HALS.

In some embodiments, the second polymeric film substrate in the assemblies disclosed herein comprises a fluoropolymer. Fluoropolymers typically are resistant to UV degradation even in the absence of stabilizers such as UVA, HALS, and anti-oxidants. Useful fluoropolymers include ethylene-tetrafluoroethylene copolymers (ETFE), tetrafluoroethylene-hexafluoropropylene copolymers (FEP), tetrafluoroethylene-hexafluoropropylene-vinylidene fluoride copolymers (THV), polyvinylidene fluoride (PVDF), blends thereof, and blends of these and other fluoropolymers.

The substrates comprising fluoropolymer can also include non-fluorinated materials. For example, a blend of polyvinylidene fluoride and polymethyl methacrylate can be used. Useful flexible, visible and infrared light-transmissive substrates also include multilayer film substrates. Multilayer film substrates may have different fluoropolymers in different layers or may include at least one layer of fluoropolymer and at least one layer of a non-fluorinated polymer. Multilayer films can comprise a few layers (e.g., at least 2 or 3 layers) or can comprise at least 100 layers (e.g., in a range from 100 to 2000 total layers or more). The different polymers in the different multilayer film substrates can be selected, for example, to reflect a significant portion (e.g., at least 30, 40, or 50%) of UV light in a wavelength range from 300 to 400 nm as described, for example, in U.S. Pat. No. 5,540,978 (Schrenk).

Useful top sheets comprising a fluoropolymer can be commercially obtained, for example, from E.I. duPont De Nemours and Co., Wilmington, Del., under the trade designation "TEFZEL ETFE" and "TEDLAR", from Dyneon LLC, Oakdale, Minn., under the trade designations "DYNEON ETFE", "DYNEON THV", "DYNEON FEP", and "DYNEON PVDF", from St. Gobain Performance Plastics, Wayne, N.J., under the trade designation "NORTON ETFE", from Asahi Glass under the trade designation "CYTOPS", and from Denka Kagaku Kogyo KK, Tokyo, Japan under the trade designation "DENKA DX FILM".

In some embodiments, the second surface of the first polymeric film substrate is attached to the photovoltaic cell with an encapsulant layer. While other encapsulants may be useful, in some embodiments, the encapsulant layer comprises ethylene vinylacetate.

In some embodiments, the PSA layer in the assembly disclosed herein is at least 0.005 mm (in some embodiments, at least 0.01, 0.02, 0.03, 0.04, or 0.05 mm) in thickness. In some embodiments, the PSA layer has a thickness up to about 0.2 mm (in some embodiments, up to 0.15, 0.1, or 0.075 mm) in thickness. For example, the thickness of the PSA layer may be in a range from 0.005 mm to 0.2 mm, 0.005 mm to 0.1 mm, or 0.01 to 0.1 mm.

Not only does the PSA serve as a convenient means for attaching the second polymeric film substrate to the barrier film in the assembly disclosure herein, it is also believed that the PSA layer serves to protect the barrier assembly from thermal stresses that may be caused by CTE mismatch between the second polymeric film substrate, which may be a fluoropolymer, and the first polymeric film substrate on which the barrier film is disposed. The PSA layer according to the present disclosure, which includes an ultraviolet light-absorbing oligomer, further provides protection to the barrier film from degradation by UV light.

The UV resistance of the PSA and the durability of the protection provided can be evaluated, for example, using accelerated weathering studies. Accelerated weathering studies are generally performed on films using techniques similar to those described in ASTM G-155, "Standard practice for exposing non-metallic materials in accelerated test devices that use laboratory light sources". The noted ASTM technique is considered a sound predictor of outdoor durability, that is, ranking materials performance correctly. One mechanism for detecting the change in physical characteristics is the use of the weathering cycle described in ASTM G155 and a D65 light source operated in the reflected mode. Under the noted test, and when the UV protective layer is applied to the article, the article should withstand an exposure of at least 18,700 kJ/m² at 340 nm before the b* value obtained using the CIE L*a*b* space increases by 5 or less, 4 or less, 3 or less, or 2 or less before the onset of significant cracking, peeling, delamination or haze.

Some Embodiments of the Disclosure

In a first embodiment, the present disclosure provides a composition comprising a blend of a pressure sensitive adhesive and an ultraviolet light-absorbing oligomer, wherein the ultraviolet light-absorbing oligomer comprises:
first divalent units comprising a pendent ultraviolet absorbing group; and
second divalent units represented by formula:

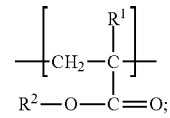

wherein
$R^1$ is hydrogen or methyl; and
$R^2$ is alkyl having from 4 to 20 carbon atoms,
and wherein the pressure sensitive adhesive is an acrylic pressure sensitive adhesive comprising the second divalent unit, and wherein for at least some of the second divalent units in the pressure sensitive adhesive $R^2$ is alkyl having the same number of carbon atoms as at least some of the second divalent units in the ultraviolet light-absorbing oligomer.

In a second embodiment, the present disclosure provides the composition of the first embodiment, wherein $R^2$ is alkyl having 8 carbon atoms.

In a third embodiment, the present disclosure provides the composition of the first or second embodiment, wherein the ultraviolet light-absorbing oligomer has a number average molecular weight of up to one half the number average molecular weight of the pressure sensitive adhesive.

In a fourth embodiment, the present disclosure provides the composition of any one of the first to third embodiments, wherein at least one of the pressure sensitive adhesive or the ultraviolet light-absorbing oligomer further comprises a third divalent unit comprising a pendent carboxylic acid, hydroxyl, aminocarbonyl, alkylaminocarbonyl, or dialkylaminocarbonyl group, wherein the alkyl in the alkylaminocarbonyl or dialkylaminocarbonyl is optionally substituted by hydroxyl.

In a fifth embodiment, the present disclosure provides the composition the fourth embodiment, wherein both the pressure sensitive adhesive and the ultraviolet light-absorbing oligomer comprise the same third divalent unit.

In a sixth embodiment, the present disclosure provides the composition of any one of the first to fifth embodiments, wherein the pendent ultraviolet absorbing group comprises a triazine, a benzophenone, or a benzotriazole.

In a seventh embodiment, the present disclosure provides the composition any one of the first to sixth embodiments, wherein each first divalent unit is independently represented by formula:

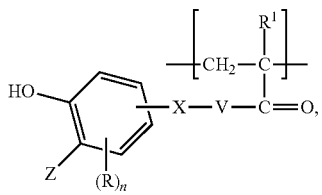

wherein
$R^1$ is independently hydrogen or methyl;
V is O or NH;
X is a bond, alkylene, or alkyleneoxy, wherein the alkylene or alkyleneoxy have from 1 to 10 carbon atoms and are optionally interrupted by one or more —O— groups and optionally substituted by a hydroxyl group;
R is alkyl having from one to four carbon atoms;
n is 0 or 1; and
Z is a benzoyl group optionally substituted by hydroxyl, alkyl, halogen, or hydroxyl; a 4,6-bisphenyl[1,3,5]triazin-2-yl group wherein each phenyl is optionally independently substituted by one or more alkyl or alkoxy groups; or a 2H-benzotriazol-2-yl group optionally substituted by one or more halogens.

In an eighth embodiment, the present disclosure provides the composition of any one of the first to seventh embodiments, wherein at least some of the first divalent units in the ultraviolet light-absorbing oligomer comprise different Z groups.

In a ninth embodiment, the present disclosure provides the composition of any one of the first to eighth embodiments, wherein the ultraviolet light-absorbing oligomer is in the composition in an amount ranging from 0.5 percent to 25 percent by weight, based on the total weight of the composition.

In a tenth embodiment, the present disclosure provides the composition any one of the first to ninth embodiments, wherein the composition comprises a second, different ultraviolet light-absorbing oligomer in the blend, and wherein the first divalent units in the ultraviolet light-absorbing oligomer and in the second, different ultraviolet light-absorbing oligomer comprise different Z groups.

In an eleventh embodiment, the present disclosure provides the composition of the tenth embodiments, wherein the ultraviolet light-absorbing oligomer and the second, different ultraviolet light-absorbing oligomer are in the composition in a combined amount ranging from 1 percent to 25 percent by weight, based on the total weight of the composition.

In a twelfth embodiment, the present disclosure the composition of any one of the first to eleventh embodiments, wherein the ultraviolet absorbing group is in the composition in an amount ranging from 0.5 weight percent to 15 weight percent, based on the total weight of the composition.

In a thirteenth embodiment, the present disclosure provides an article comprising the composition of any one of the first to twelfth embodiments.

In a fourteenth embodiment, the present disclosure provides the article of the thirteenth embodiment, wherein the article is a photovoltaic device.

In a fifteenth embodiment, the present disclosure provides the article of the thirteenth or fourteenth embodiment, wherein the composition is disposed on at least a portion of a surface of a film.

In a sixteenth embodiment, the present disclosure provides the article of the fifteenth embodiment, wherein the film is at least one of a graphic film, an architectural film, a window film, or a vehicle wrap.

In a seventeenth embodiment, the present disclosure provides the article of the fifteenth embodiments, wherein the film is a barrier film.

In an eighteenth embodiment, the present disclosure provides an assembly comprising:
a first polymeric film substrate having a first surface and a second surface opposite the first surface;
a barrier film disposed on the first surface of the first polymeric film;
a pressure sensitive adhesive layer having a first surface and a second surface opposite the first surface, wherein the first surface of the pressure sensitive adhesive is disposed on the barrier film opposite the first polymeric film substrate; and
a second polymeric film substrate disposed on the second surface of the pressure sensitive adhesive layer,
wherein pressure sensitive adhesive layer comprises an ultraviolet light-absorbing oligomer comprising:
first divalent units comprising a pendent ultraviolet absorbing group; and
second divalent units represented by formula:

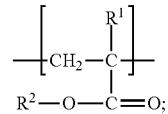

wherein
$R^1$ is hydrogen or methyl; and
$R^2$ is alkyl having from 4 to 20 carbon atoms.

In a nineteenth embodiment, the present disclosure provides the assembly of the eighteenth embodiment, wherein the pressure sensitive adhesive layer comprises at least one of an acrylate, silicone, polyisobutylene, urea, natural rubber, or an ABA triblock copolymer of styrene and hydrogenated polybutadiene, hydrogenated polyisoprene, or a combination of hydrogenated polybutadiene and polyisoprene.

In a twentieth embodiment, the present disclosure provides the assembly of the eighteenth or nineteenth embodiment, wherein the pressure sensitive adhesive layer comprises an acrylic pressure sensitive adhesive.

In a twenty-first embodiment, the present disclosure provides the assembly of any one of the eighteenth to twentieth embodiments, wherein the pressure sensitive adhesive layer comprises an acrylic pressure sensitive adhesive comprising the second divalent unit, and wherein for at least some of the second divalent units in the pressure sensitive adhesive $R^2$ is alkyl having the same number of carbon atoms as at least some of the second divalent units in the ultraviolet light-absorbing oligomer.

In a twenty-second embodiment, the present disclosure provides the assembly of any one of the eighteenth to twenty-first embodiment, wherein $R^2$ is alkyl having 8 carbon atoms.

In a twenty-third embodiment, the present disclosure provides the assembly of any one of the eighteenth to twenty-second embodiments, wherein the ultraviolet light-absorbing oligomer has a number average molecular weight of up to one half the number average molecular weight of the pressure sensitive adhesive.

In a twenty-fourth embodiment, the present disclosure provides the assembly of any one of the twentieth to twenty-third embodiments, wherein at least one of the pressure sensitive adhesive or the ultraviolet light-absorbing oligomer further comprises a third divalent unit comprising a pendent carboxylic acid, hydroxyl, aminocarbonyl, alkylaminocarbonyl, or dialkylaminocarbonyl group, wherein the alkyl in the alkylaminocarbonyl or dialkylaminocarbonyl is optionally substituted by hydroxyl.

In a twenty-fifth embodiment, the present disclosure provides the assembly of the twenty-fourth embodiment, wherein both the pressure sensitive adhesive and the ultraviolet light-absorbing oligomer comprise the same third divalent unit.

In a twenty-sixth embodiment, the present disclosure provides the assembly of any one of the eighteenth to twenty-fifth embodiments, wherein the pendent ultraviolet absorbing group comprises a triazine, a benzophenone, or a benzotriazole.

In a twenty-seventh embodiment, the present disclosure provides the assembly of any one of the eighteenth to twenty-sixth embodiments, wherein each first divalent unit is independently represented by formula:

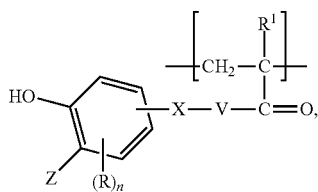

wherein
$R^1$ is independently hydrogen or methyl;
V is O or NH;
X is a bond, alkylene, or alkyleneoxy, wherein the alkylene or alkyleneoxy have from 1 to 10 carbon atoms and are optionally interrupted by one or more —O— groups and optionally substituted by a hydroxyl group;
R is alkyl having from one to four carbon atoms;
n is 0 or 1; and
Z is a benzoyl group optionally substituted by hydroxyl, alkyl, halogen, or hydroxyl; a 4,6-bisphenyl[1,3,5]triazin-2-yl group wherein each phenyl is optionally independently substituted by one or more alkyl or alkoxy groups; or a 2H-benzotriazol-2-yl group optionally substituted by one or more halogens.

In a twenty-eighth embodiment, the present disclosure provides the assembly of the twenty-seventh embodiment, wherein at least some of the first divalent units in the ultraviolet light-absorbing oligomer comprise different Z groups.

In a twenty-ninth embodiment, the present disclosure provides the assembly of the twenty-seventh or twenty-eighth embodiment, wherein the pressure sensitive adhesive layer comprises a second, different ultraviolet light-absorbing oligomer in the blend, and wherein the first divalent units in the ultraviolet light-absorbing oligomer and in the second, different ultraviolet light-absorbing oligomer comprise different Z groups.

In a thirtieth embodiment, the present disclosure provides the assembly of the twenty-ninth embodiment, wherein the ultraviolet light-absorbing oligomer and the second, different ultraviolet light-absorbing oligomer are in the pressure sensitive adhesive layer in a combined amount ranging from 1 percent to 25 percent by weight, based on the total weight of the pressure sensitive adhesive layer.

In a thirty-first embodiment, the present disclosure provides the assembly of any one of the eighteenth to thirtieth embodiments, wherein the ultraviolet light-absorbing oligomer is in the pressure sensitive adhesive layer in an amount ranging from 0.5 percent to 25 percent by weight, based on the total weight of the pressure sensitive adhesive layer.

In a thirty-second embodiment, the present disclosure provides the assembly of any one of the eighteenth to thirty-first embodiments, wherein the ultraviolet absorbing group is in the pressure sensitive adhesive layer in an amount ranging from 0.5 weight percent to 15 weight percent, based on the total weight of the composition.

In a thirty-third embodiment, the present disclosure provides the assembly of any one of the eighteenth to thirty-second embodiments, wherein the barrier film comprises at least first and second polymer layers separated by an inorganic barrier layer.

In a thirty-fourth embodiment, the present disclosure provides the assembly of the thirty-third embodiment, wherein the inorganic barrier layer is an oxide layer.

In a thirty-fifth embodiment, the present disclosure provides the assembly of any one of the eighteenth to thirty-fourth embodiments, wherein the barrier film comprises a plurality of alternating oxide layers and second polymer layers on the first polymeric film substrate.

In a thirty-sixth embodiment, the present disclosure provides the assembly of any one of the eighteenth to thirty-fifth embodiments, wherein the first polymeric film substrate comprises at least one of polyethylene, terephthalate, polyethylene, naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

In a thirty-seventh embodiment, the present disclosure provides the assembly of any one of the thirty-third to thirty-sixth embodiments, wherein at least one of the first or second polymer layers comprises a polymerized acrylate or methacrylate.

In a thirty-eighth embodiment, the present disclosure provides the assembly of the thirty-seventh embodiment, wherein the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, pentaerythritol tetraacrylate, propoxylated (3) glyceryl diacrylate, propoxylated (5,5) glyceryl diacrylate, propoxylated (3) trimethylolpropane diacrylate, propoxylated (6) trimethylolpropane diacrylate, trimethylolpropane diacrylate, trimethylolpropane triacrylate, di-trimethylolpropane tetraacrylate, dipentaerythritol pentaacrylate, or combinations thereof.

In a thirty-ninth embodiment, the present disclosure provides the assembly of any one of the thirty-third to thirty-eighth embodiments, wherein at least one of the first or second polymer layers comprises a siloxane reaction product of an amino-functional silane.

In a fortieth embodiment, the present disclosure provides the assembly of the thirty-ninth embodiment, wherein the siloxane reaction product shares a siloxane bond with the oxide layer.

In a forty-first embodiment, the present disclosure provides the assembly of any one of the eighteenth to the fortieth embodiments, wherein the second polymeric film substrate comprises at least one of an ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

In a forty-second embodiment, the present disclosure provides the assembly of any one of the eighteenth to forty-first embodiments, wherein second surface of the first polymeric film substrate is disposed on a photovoltaic cell.

In a forty-third embodiment, the present disclosure provides the assembly of the forty-second embodiment, wherein the photovoltaic cell is a CIGS cell.

In forty-fourth embodiment, the present disclosure provides the assembly of the forty-second or forty-third embodiment, wherein the second surface of the first polymeric film substrate is attached to the photovoltaic cell with an encapsulant layer.

In forty-fifth embodiment, the present disclosure provides the assembly of the forty-fourth embodiment, wherein the encapsulant layer comprises ethylene vinylacetate.

In a forty-sixth embodiment, the present disclosure provides the assembly of any one of the eighteenth to forty-fifth embodiments, wherein the barrier film has at least one of an oxygen transmission rate less than 0.005 $g/m^2$/day at 23° C. and 90% relative humidity or a water vapor transmission rate less than 0.005 $g/m^2$/day at 50° C. and 100% relative humidity.

Embodiments of the compositions and methods disclosed herein are further illustrated by the following examples, but the particular materials and amounts thereof recited in these examples, as well as other conditions and details, should not be construed to unduly limit this invention.

EXAMPLES

Molecular Weight Determination

In the following oligomer examples, the molecular weight was determined by comparison to linear polystyrene polymer standards using gel permeation chromatography (GPC). The GPC measurements were carried out on a Waters Alliance 2695 system (obtained from Waters Corporation, Milford, Mass.) using four 300 millimeter (mm) by 7.8 mm linear columns of 5 micrometer styrene divinylbenzene copolymer particles (obtained from Polymer Laboratories, Shropshire, UK, under the trade designation "PLGEL") with pore sizes of 10,000, 1000, 500, and 100 angstroms. A refractive index detector from Waters Corporation (model 410) was used at 40° C. A 50-milligram (mg) sample of oligomer in ethyl acetate was diluted with 10 milliliters (mL) of tetrahydrofuran (inhibited with 250 ppm of BHT) and filtered through a 0.45 micrometer syringe filter. A sample volume of 100 microliters was injected onto the column, and the column temperature was 40° C. A flow rate of 1 mL/minute was used, and the mobile phase was tetrahydrofuran. Molecular weight calibration was performed using narrow dispersity polystyrene standards with peak average molecular weights ranging from $3.8 \times 10^5$ grams per mole to 580 grams per mole. Calibration and molecular weight distribution calculations were performed using suitable GPC software using a third order polynomial fit for the molecular weight calibration curve. Each reported result is an average of duplicate injections.

Glass Transition Temperature

For the following oligomer examples, the glass transition temperatures were measured by Differential Scanning Calorimetry (DSC) using Q2000 Differential Scanning Calorimeter obtained from TA Instruments, New Castle, Del. Glass transition temperature was determined using Modulated DSC with a modulation amplitude of ±1° C. per minute and a ramp rate of 3° C. per minute.

Preparative Example 1

2-{4-[4,6-Bis-(2,4-dimethyl-phenyl)-[1,3,5]triazin-2-yl]-3-hydroxy-phenoxy}-ethyl Acrylate Ester

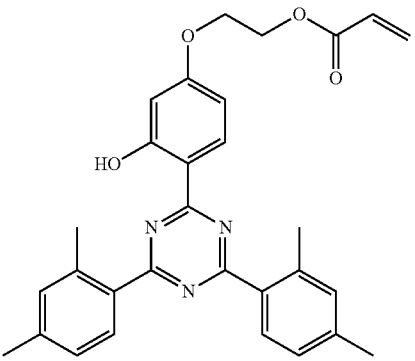 [SMILES: C=CC(=O)OCCOc1ccc(-c2nc(-c3ccc(C)cc3C)nc(-c3ccc(C)cc3C)n2)c(O)c1]

Part A

A three liter 3-neck round bottom flask was equipped with a temperature probe, condenser and mechanical stirrer. The flask was charged with 500 grams (1.26 moles) of 2,4-di-(2,4-dimethylphenyl)-6-(2,4-dihydroxyphenyl)-triazine, 124 grams (1.4 moles) of ethylene carbonate, 18 grams (0.085 moles) tetraethylammonium bromide and 475 grams of dimethyl formamide. The batch was heated to 150° C. and maintained at that temperature for five hours. The evolution of $CO_2$ from the batch was observed. After five hours, 15 grams additional ethylene carbonate and 2 grams additional tetraethylammonium bromide were added. The batch was heated at 150° C. for three hours, and then 15 grams additional ethylene carbonate and 2 grams additional tetraethylammonium bromide were added. The batch was heated at 150° C. for three more hours, after which time no more starting material was observed by thin layer chromatography.

The batch was allowed to cool to 80° C., and 1360 grams of isopropanol (IPA) was added with good agitation. The mixture was cooled to room temperature, and the solid product was collected by filtration onto a Buchner funnel. The solid product was taken up into 1000 grams each of water and IPA, stirred well, and collected by filtration onto a Buchner funnel. The product was air-dried to give 540 grams (96%) of an off-white solid product, 2-[4,6-bis-(2,4-dimethylphenyl)-[1,3,5]triazin-2-yl]-5-(2-hydroxyethoxy) phenol, mp=172° C.-173° C. The product was used without further purification.

Part B

A two liter 3-neck round bottom flask was equipped with a temperature probe, Dean-Stark trap with condenser, and mechanical stirrer. The flask was charged with 170 grams (0.385 moles) of 2-[4,6-bis-(2,4-dimethylphenyl)-[1,3,5]triazin-2-yl]-5-(2-hydroxyethoxy)phenol, prepared in Part A, 780 grams of toluene, 0.24 grams of 4-methoxyphenol (MEHQ) inhibitor, 0.38 grams of phenothiazine inhibitor, 8.5 grams of p-toluene sulfonic acid, and 30.5 grams (0.42 moles) of acrylic acid. The batch was heated with medium agitation at reflux (about 115° C.) for six hours, and the azeotroped water can collected in the Dean-Stark trap. After five hours, five grams additional acrylic acid was added, and the batch was heated for three more hours. Analysis by thin layer chromatography showed the batch had no residual starting material.

The batch was allowed to cool to 80° C., and a pre-mix of 25 grams sodium carbonate in 300 grams water was added. The reaction mixture was cooled to about 10° C. with an ice bath, and the precipitated product was collected by filtration on a Buchner funnel. The solid was taken back up in a mixture of 800 grams water and 200 grams IPA, and the mixture was stirred well and filtered. The product was air-dried to give 182 grams (96%) of the off-white solid product, 2-{4-[4,6-bis-(2,4-dimethyl-phenyl)-[1,3,5]triazin-2-yl]-3-hydroxyphenoxy}ethyl acrylate ester, mp=126° C.-128° C. The structure was confirmed by $^1$H NMR spectroscopy.

Preparative Example 2

2-(4-Benzoyl-3-hydroxyphenoxy)ethyl Acrylate Ester

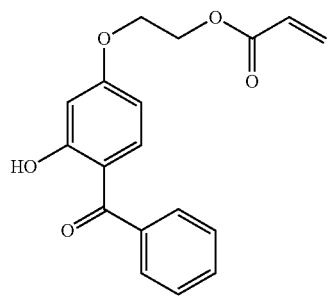 [SMILES: C=CC(=O)OCCOc1ccc(C(=O)c2ccccc2)c(O)c1]

Part A

A five liter 3-neck round bottom flask was equipped with a temperature probe, condenser, and mechanical stirrer. The flask was charged with 500 grams (2.33 moles) of 2,4-dihydroxybenzophenone, 216 grams (2.45 moles) of ethylene carbonate, and 25 grams (0.12 moles) tetraethylammonium bromide. The batch was heated to 140° C. and maintained at that temperature for twenty-four hours. The evolution of $CO_2$ from the batch was observed. Analysis by thin layer chromatography showed the batch had no residual starting material.

The batch was allowed to cool to 80° C., and 1200 grams of isopropanol was added with good agitation. The batch temperature was held at about 60° C., and 2500 grams of water was added while maintaining the batch temperature at about 60° C. The batch was cooled to room temperature with slow agitation, and the product was collected by filtration onto a Buchner funnel. The solid product was taken back up into 1000 grams of water and 200 grams of IPA, stirred well, and collected by filtration onto a Buchner funnel. The product was air-dried to give 545 grams (90%) of an off-white solid product, 2-hydroxy-4-(2-hydroxyethyl)benzophenone, mp=88° C.-89° C. The product was used without further purification.

Part B

A two liter 3-neck round bottom flask was equipped with a temperature probe, Dean-Stark trap with condenser, and mechanical stirrer. The flask was charged with 200 grams (0.77 moles) of 2-hydroxy-4-(2-hydroxyethyl)benzophenone, prepared in Part A, 850 grams toluene, 0.48 grams MEHQ inhibitor, 0.77 grams phenothiazine inhibitor, 17 grams p-toluene sulfonic acid, and 61.4 grams (0.85 moles) of acrylic acid. The batch was heated with medium agitation at reflux (about 115° C.) for six hours, and the azeotroped water was collected in the Dean-Stark trap. After five hours, five grams additional acrylic acid was added, and the batch was heated for three more hours. Analysis by thin layer chromatography showed the batch had no residual starting material.

The batch was cooled to 80° C., and a pre-mix of 25 grams sodium carbonate in 300 grams water was added. The batch was phase split, and the lower aqueous layer was removed. The organic layer was washed with a mixture of 25 grams sodium chloride in 300 grams water. The solvent was stripped using a rotary evaporator. The residual brown oil product was taken up in 230 grams of IPA, and heated to about 60° C. to make a solution. The mixture was agitated gently and cooled to −10° C. to crystallize the off-white solid product. The product was air-dried to give 217 grams (90%) of the off-white solid product, 2-(4-benzoyl-3-hydroxyphenoxy)ethyl acrylate ester, mp=126° C.-128° C. The structure was confirmed by $^1$H NMR spectroscopy.

Preparative Example 3

2-[4-(4,6-Diphenyl)-[1,3,5]triazin-2-yl]-3-hydroxy-phenoxy}-ethyl prop-2-enoate

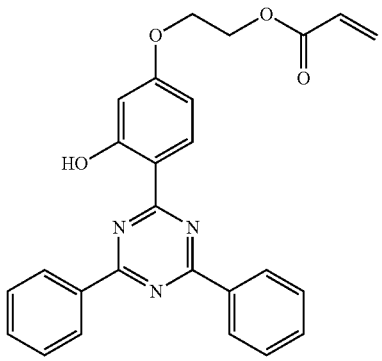 [SMILES: C=CC(=O)OCCOc1ccc(-c2nc(-c3ccccc3)nc(-c3ccccc3)n2)c(O)c1]

Part A

A two liter 3-neck round bottom flask was equipped with a temperature probe, condenser and mechanical stirrer. The flask was charged with 400 grams (1.17 moles) of 4-(4,6-diphenyl-1,3,5-triazin-2-yl)benzene-1,3-diol, 115.5 grams (1.31 moles) of ethylene carbonate, 16.7 grams (0.085 moles) tetraethylammonium bromide and 440 grams of dimethyl formamide (DMF). The batch was heated to 150° C. and maintained at that temperature for five hours. The evolution of $CO_2$ from the batch was observed. After five hours, 10 grams additional ethylene were added. The batch was heated at 150° C. for three hours, and then 15 grams additional ethylene carbonate and 2 grams additional tetraethylammonium bromide were added. The batch was heated at 150° C. for three more hours, after which time no more starting material was observed by thin layer chromatography.

The batch was allowed to cool to 80° C., and 730 grams of isopropanol (IPA) was added. The mixture was thick, and a mixture of 50/50 IPA/water was added to improve stirring. The solid product was then collected by filtration onto a Buchner funnel. The solid product was taken up into 2500 grams of DMF, heated at reflux, cooled to room temperature, and collected by filtration onto a Buchner funnel. The product was air-dried to give 373 grams (83%) of an off-white solid product 2-(4,6-diphenyl-1,3,5-triazin-2-yl)-5-(2-hydroxyethoxy)phenol.

Part B

A two liter 3-neck round bottom flask was equipped with a temperature probe, Dean-Stark trap with condenser, and mechanical stirrer. The flask was charged with 150 grams (0.389 moles) of 2-(4,6-diphenyl-1,3,5-triazin-2-yl)-5-(2-hydroxyethoxy)phenol, prepared in Part A, 790 grams of toluene, 0.24 grams of 4-methoxyphenol (MEHQ) inhibitor, 0.38 grams of phenothiazine inhibitor, 8.5 grams of p-toluene sulfonic acid, and 30.8 grams (0.43 mole) of acrylic acid. The batch was heated with medium agitation at reflux (about 115° C.) for six hours, and the azeotroped water was collected in the Dean-Stark trap. After five hours, five grams additional acrylic acid was added, and the batch was heated for three more hours. Analysis by thin layer chromatography eluting with 50/50 ethyl acetate/hexanes showed the batch had no residual starting material.

The batch was allowed to cool to 80° C., and 65 grams of triethyl amine was added. The batch was heated at reflux at atmospheric pressure to remove most of the toluene. The pot temperature was 120° C., and about 650 grams of toluene were collected. The batch was allowed to cool to 75° C., and 500 grams IPA were added. The mixture was heated at reflux (about 82° C.) to azetrope off the toluene and IPA. About 500 grams of solvent were collected. The reaction mixture was cooled to about 20° C. with an ice bath, and 500 grams of IPA were added with stirring. The precipitated product was collected by filtration on a Buchner funnel. The solid was taken back up in a mixture of 700 grams water and 700 grams IPA, and the mixture was stirred well and filtered. The product was air-dried to give 161.8 grams (95%) of the light yellow solid product, mp=125° C.-127° C.

To further purify, about 90 grams of the light yellow solid was combined with 1200 grams MEK and heated to 40° C. Five grams of charcoal was added, and the mixture was stirred well and filtered through a bed of filter aid. The solvent was removed using a rotary evaporator, and then 400 grams IPA was added. The mixture was stirred well, and the solid product 2-[4-(4,6-diphenyl)-[1,3,5]triazin-2-yl]-3-hydroxy-phenoxy}-ethyl prop-2-enoate, was collected by filtration. mp=126° C. to 128° C. The structure was confirmed by $^1$H NMR spectroscopy.

Preparative Oligomer Example 1

Random Copolymer of 76% by Weight Isooctyl Acrylate, 4% Acrylic Acid, 12% Preparative Example 1, and 8% Preparative Example 2

Isooctyl acrylate (380 g, obtained from 3M Company, St. Paul, Minn.) was mixed with 60 g of Preparative Example 1, 40 g of Preparative Example 2, 12.5 g of 2,2'-azobis(2-methylbutyronitrile) (obtained from E.I. du Pont de Nemours and Company, Wilmington, Del., under the trade designation "VAZO 67", and 500 g of ethyl acetate in a three-liter flask fitted with a thermocouple, overhead stirrer, and a reflux condenser under positive nitrogen flow. After the addition of materials was completed, the flask was maintained under positive nitrogen pressure. The material was heated at 74° C. for 19 hours. The contents of the flask were poured out and solids were measured. 5.77 g of solution were dried, and 2.76 g of solids were obtained (47% solids). The resin solution was poured into plastic bottles to give 1029 g of solution. One glass transition temperature was observed at −23.6° C. using DSC according to the method described above with a scan from −100° C. to 150° C. The molecular weight of the oligomer was determined by GPC (THF, EMD Omnisolve, 2c PL-Gel-2 300×7.5 mm, polystyrene standard): Mw=271,000, Mn=114,000, Mz=551,300, and a polydispersity of 2.38.

Preparative Oligomer Example 2

Random Copolymer of 80% by Weight Isooctyl Acrylate and 20% Preparative Example 1

Isooctyl acrylate (400 g, obtained from 3M Company, St. Paul, Minn.) was mixed with 100 g of Preparative Example 1, 6.0 g of 2,2'-azobis(2-methylbutyronitrile) (obtained from E.I. du Pont de Nemours and Company under the trade designation "VAZO 67", and 500 g of ethyl acetate in a three-liter flask fitted with a thermocouple, overhead stirrer, and a reflux condenser under positive nitrogen flow. After the addition of materials was completed, the flask was maintained under positive nitrogen pressure. The material was heated at 74° C. for 19 hours. The contents of the flask were poured out and solids were measured. 4.59 g of solution were dried, and 2.43 g of solids were obtained (53% solids). The resin solution was poured into plastic bottles to give 943 g of solution. One glass transition temperature was observed at −31.3° C. using DSC according to the method described above with a scan from −100° C. to 150° C. The molecular weight of the oligomer was determined by GPC (THF, EMD Omnisolve, 2c PL-Gel-2 300×7.5 mm, polystyrene standard): Mw=241,000, Mn=99,490, Mz=433,000, and a polydispersity of 2.43.

Preparative Oligomer Example 3

Random Copolymer of 80% by Weight Isooctyl Acrylate and 20% 2-[2-Hydroxy-5-[2-(methacryloyloxy)-ethyl]phenyl]-2H-benzotriazole 2-[2-Hydroxy-5-[2-(methacryloyloxy)-ethyl]phenyl]-2H-benzotriazole was obtained from TCI America, Portland, Oreg. Isooctyl acrylate (400 g, obtained from 3M Company, St. Paul, Minn.) was mixed with 100 g of 2-[2-hydroxy-5-[2-(methacryloyloxy)-ethyl]phenyl]-2H-benzotriazole, 5.0 g of 2,2'-azobis(2-methylbutyronitrile) (obtained from E.I. du Pont de Nemours and Company under the trade designation "VAZO 67", and 500 g of ethyl acetate in a three-liter flask fitted with a thermocouple, overhead stirrer, and a reflux condenser under positive nitrogen flow. After the addition of materials was completed, the flask was maintained under positive nitrogen pressure. The material was heated at 74° C. for 19 hours. The contents of the flask were poured out and solids were measured. 2.91 g of solution were dried, and 1.49 g of solids were obtained (51% solids). The resin solution was poured into plastic bottles to give 993 g of solution. One glass transition temperature was observed at −36.7° C. using DSC according to the method described above with a scan from −100° C. to 150° C. The molecular weight of the oligomer was determined by GPC (THF, EMD Omnisolve, 2c PL-Gel-2 300×7.5 mm, polystyrene standard): Mw=574,100, Mn=96,120, Mz=1,663,000, and a polydispersity of 5.98.

Preparative Oligomer Example 4

Random Copolymer of 80% by Weight Isooctyl Acrylate, 20% by Weight Preparative Example 3

Forty grams of isooctyl acrylate (obtained from TCI America) was mixed with 10 g of Preparative Example 3, 1 g of 2,2'-azobis(2-methylbutyronitrile) (obtained from E.I. du Pont de Nemours and Company, Wilmington, Del., under the trade designation "VAZO 67"), and 100 g of ethyl acetate in a one-liter flask fitted with a thermocouple, overhead stirrer, and a reflux condenser under positive nitrogen flow. After the addition of materials was completed, the flask was maintained under positive nitrogen pressure. The material was heated at 74° C. for 1 hour and then another 1 g of 2,2'-azobis(2-methylbutyronitrile) was added. The material was heated at 74° C. for 18 hours. The contents of the flask were poured out and solids were measured. 4.13 g of solution were dried, and 1.53 g of solids were obtained (37% solids). The resin solution was poured into a plastic bottle to give 134 g of solution. One glass transition temperature was observed at −31.9° C. using DSC according to the method described above with a scan from −100° C. to 150° C.

This oligomer can be incorporated into a pressure sensitive adhesive composition, for example, that is prepared from components comprising isooctyl acrylate.

Preparative Oligomer Example 5

Random Copolymer of 80% by Weight Methyl Methacrylate and 20% Preparative Example 1

Preparative Oligomer Example 1 was prepared by the general method described in U.S. Pat. No. 5,986,011 (Ellis). In a first step of the polymerization, a stainless steel reactor was charged with a mixture of 64 grams of methyl methacrylate (obtained from Rohm and Haas, Philadelphia, Pa.), 16 grams of Preparative Example 1, 4.0 g ethyl acetate, 0.08 grams of an antioxidant obtained from BASF, Florham Park, N.J., under the trade designation "IRGANOX 1010", 2.4 grams of chain transfer agent isooctyl thioglycolate (IOTG), 0.34 grams of MEHQ, and 0.024 grams of 2,2'-azobis(2,4 dimethylpentanenitrile) obtained from E.I. du Pont de Nemours and Company, Wilmington, Del., under the trade designation "VAZO 52". The reactor was sealed, purged of oxygen with nitrogen, and then held at approximately 100 psig nitrogen pressure. The reaction mixture was heated in a first step to 60° C. and then allowed to polymerize adiabatically, peaking at 113° C. When the reaction was complete, the mixture was cooled to below 50° C.

A solution of various initiators dissolved in 18.64 grams ethyl acetate (0.80 grams of 2,2'-azobis(2,4 dimethylpentanenitrile) obtained from E.I. du Pont de Nemours and Company under the trade designation "VAZO 52", 0.20 grams of 2,2'-azobis(2-methylbutanenitrile) obtained from E.I. du Pont de Nemours and Company under the trade designation "VAZO 67", 0.20 grams of 2,2'-azobis(cyclohexanecarbonitrile) obtained from E.I. du Pont de Nemours and Company under the trade designation "VAZO 88", 0.20 grams of 2,5-dimethyl-2,5 di-(t-butylperoxy)hexane obtained from Elf Atochem, Philadelphia, Pa., under the trade designation "LUPERSOL 101", and 0.16 grams of 2,5-dimethyl-2,5-di-(t-butylperoxy)hexyne-3 obtained from Elf Atochem under the trade designation "LUPERSOL 130") and 1.13 grams of IOTG was then added to the product of the first step. The reactor was sealed and purged of oxygen with nitrogen, and then held at 100 psig nitrogen pressure. The reaction mixture was heated to 60° C. and then allowed to polymerize adiabatically. After the reaction reached peak temperature of 144° C., the mixture was held at 145° C. for 1 hour and drained, while hot, into aluminum trays. After the material cooled, the resulting solid polymer was hammered into flakes. The molecular weight of the oligomer was determined by GPC (THF, EMD Omnisolve, 2c PL-Gel-2 300×7.5 mm, polystyrene standard): Mw=108,700, Mn=54,980, and a polydispersity of 1.99.

Preparative Oligomer Example 6

Random Copolymer of 80% by Weight Methyl Methacrylate and 20% 2-[2-Hydroxy-5-[2-(methacryloyloxy)-ethyl]phenyl]-2H-benzotriazole 2-[2-Hydroxy-5-[2-(methacryloyloxy)-ethyl]phenyl]-2H-benzotriazole was obtained from TCI America, Portland, Oreg. Preparative Oligomer Example 2 was prepared by the general method described in U.S. Pat. No. 5,986,011 (Ellis). In a first step of the polymerization, a stainless steel reactor was charged with a mixture of 64 grams of methyl methacrylate (obtained from Rohm and Haas, Philadelphia, Pa.), 16 grams of 2-[2-Hydroxy-5-[2-(methacryloyloxy)-ethyl]phenyl]-2H-benzotriazole, along with 0.08 grams of an antioxidant obtained from BASF under the trade designation "IRGANOX 1010", 2.4 grams of chain transfer agent IOTG, 0.34 grams of MEHQ, and 0.024 grams of 2,2'-azobis(2,4 dimethylpentanenitrile) obtained from E.I. du Pont de Nemours and Company under the trade designation "VAZO 52". The reactor was sealed, purged of oxygen with nitrogen, and then held at approximately 100 psig nitrogen pressure. The reaction mixture was heated in a first step to 60° C. and then allowed to polymerize adiabatically, peaking at 111° C. When the reaction was complete, the mixture was cooled to below 50° C.

A solution of various initiators dissolved in 18.64 grams ethyl acetate (0.80 grams of azobis(2,4 dimethylpentanenitrile) obtained from E.I. du Pont de Nemours and Company under the trade designation "VAZO 52", 0.20 grams of 2,2'-azobis(2-methylbutanenitrile) obtained from E.I. du Pont de Nemours and Company under the trade designation "VAZO 67", 0.20 grams of 2,2'-azobis(cyclohexanecarbonitrile) obtained from E.I. du Pont de Nemours and Company under the trade designation "VAZO 88", 0.20 grams of 2,5-dimethyl-2,5 di-(t-butylperoxy)hexane obtained from Elf Atochem under the trade designation "LUPERSOL 101", and 0.16 grams of 2,5-dimethyl-2,5-di-(t-butylperoxy) hexyne-3 obtained from Elf Atochem under the trade designation "LUPERSOL 130") and 1.13 grams of IOTG was then added to the product of the first step. The reactor was sealed and purged of oxygen with nitrogen, and then held at 100 psig nitrogen pressure. The reaction mixture was heated to 60° C. and then allowed to polymerize adiabatically. After the reaction reached peak temperature of 150° C., the mixture was warmed to and held at 170° C. for 1 hour and drained, while hot, into aluminum trays. After the material cooled, the resulting solid polymer was hammered into flakes. The molecular weight of the oligomer was determined by GPC (THF, EMD Omnisolve, 2c PL-Gel-2 300× 7.5 mm, polystyrene standard): Mw=8,090, Mn=5,824, and a polydispersity of 1.39.

Preparative Oligomer Example 7

Random Copolymer of 80% by weight Methyl Methacrylate and 20% Preparative Example 2 Preparative Oligomer Example 7 was prepared by the general method described in U.S. Pat. No. 5,986,011 (Ellis) and Preparative Oligomer Examples 5 and 6 above.

Examples 1 to 3

The solutions of each of Preparative Oligomer Examples 2, 3, and 1 were blended into in a solvent-based pressure sensitive adhesive (PSA) composition comprising 94/6 isooctyl acrylate/acrylic acid at 45% solids. The pressure sensitive adhesive composition was prepared as described in U.S. Pat. No. RE24906. 8% active UVA in the composition was targeted. The calculated quantity of Preparative Oligomer Example solution was added to the wet PSA in the glass jar and contents were mixed vigorously with an air mixer for 2 minutes. No crosslinker or other additives were added. After mixing, the contents were left to sit overnight for degassing.

Illustrative Examples 1, 2, and 3

Each of solid Preparative Oligomer Examples 5, 6, and 7 were blended into in the solvent-based PSA composition described in Examples 1, 2, and 3. The calculations described for Examples 1, 2, and 3 were used except that since Preparative Oligomer Examples 5, 6, and 7 were solid, there was no % solids calculation. The calculated amount of oligomeric material was then placed into a separate glass jar with excess ethyl acetate, shaken/stirred and heated on a hot plate until contents were visibly dissolved. These contents were then poured into the PSA in the glass jar and contents were mixed vigorously with an air mixer for 2 minutes. No crosslinker or other additives were added. After mixing, the contents were left to sit overnight for degassing.

Comparative Examples 1, 2, and 3

A triazine UV absorber obtained from BASF, Florham Park, N.J., under the trade designation "TINUVIN 479" and a benzotriazole UV absorber obtained from BASF under the trade designation "TINUVIN 928" were also blended into the PSA composition described in Examples 1, 2, and 3. The targeted amount was based on the percent solids of the PSA composition. These UV absorbers were 100% active. The calculated amount was added to the PSA in the glass jar and contents were mixed vigorously with an air mixer for 2 minutes. No crosslinker or other additives were added. After mixing, the contents were left to sit overnight for degassing.

To produce handspreads of each of Examples 1 to 3, Illustrative Examples 1 to 3, and Comparative Examples 1 to 3, a notchbar coater was used. The solution described above for each of Examples 1 to 3, Illustrative Examples 1 to 3, and Comparative Examples 1 to 3 was poured onto a 2 mil silicone release liner and a 6-8 mil gap was set. Samples were poured, pulled through the notch bar and placed into an oven at 200° F. for 5-10 minutes, after which the liner was removed and 2 mil ETFE was hand laminated to both sides of the adhesive. This produced a sandwich structure with the adhesive between the films. Each film was subsequently evaluated for transmission, haze and clarity using a Haze-Gard Plus instrument (BYK-Gardner USA, Columbia, Md.). The data is shown in Table 1, below.

TABLE 1

| Example | UV absorber | UVA chemistry | Target UVA loading | Film transmission | Film clarity |
| --- | --- | --- | --- | --- | --- |
| Comp. Ex. 1 | "TINUVIN 479" | Triazine | 4% | 95 | 99 |
| Comp. Ex. 2 | "TINUVIN 479" | Triazine | 8% | 83.7 | 99 |
| Comp. Ex. 3 | "TINUVIN 928" | Benzotriazole | 8% | 95 | 99 |
| Ill. Ex. 1 | Prep. Olig. Ex. 5 | Triazine | 8% | 93.8 | 54 |
| Ill. Ex. 2 | Prep. Olig. Ex. 6 | Benzotriazole | 8% | 95 | 24 |
| Ill. Ex. 3 | Prep. Olig. Ex. 7 | Benzophenone | 8% | 94 | 16 |
| Example 1 | Prep. Olig. Ex. 2 | Triazine | 8% | 94.6 | 95 |
| Example 2 | Prep. Olig. Ex. 3 | Benzotriazole | 8% | 94.8 | 85 |
| Example 3 | Prep. Olig. Ex. 1 | Triazine Benzophenone | 8% | 94.8 | 93 |

What is claimed is:

1. A composition comprising a blend of a pressure sensitive adhesive and an ultraviolet light-absorbing oligomer, wherein the ultraviolet light-absorbing oligomer comprises:
first divalent units comprising a pendent ultraviolet absorbing group, wherein the pendent ultraviolet absorbing group comprises a triazine, a benzophenone, or a benzotriazole; and
second divalent units represented by formula:

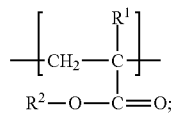

wherein
$R^1$ is hydrogen or methyl; and
$R^2$ is alkyl having 8 carbon atoms,
wherein the second divalent units are present in the ultraviolet light-absorbing oligomer at 70 percent by weight up to 90 percent by weight, based on the total weight of the oligomer, wherein the pressure sensitive adhesive is an acrylic pressure sensitive adhesive comprising an acrylic polymer, wherein the second divalent units are present in the acrylic polymer in an amount of 80 percent by weight up to 100 percent by weight, based on the total weight of the acrylic polymer, wherein the ultraviolet absorbing group is in the composition in an amount of at least 2 percent by weight and in an amount of up to 10 weight percent, based on the total weight of the composition, and wherein the pressure sensitive adhesive does not comprise a third divalent unit comprising a pendent hydroxyl group.

2. The composition of claim 1, wherein the ultraviolet light-absorbing oligomer has a number average molecular weight of up to one half the number average molecular weight of the pressure sensitive adhesive.

3. The composition of claim 1, wherein at least one of the pressure sensitive adhesive or the ultraviolet light-absorbing oligomer further comprises a third divalent unit comprising a pendent carboxylic acid, aminocarbonyl, alkylaminocarbonyl, or dialkylaminocarbonyl group.

4. The composition of claim 3, wherein both the pressure sensitive adhesive and the ultraviolet light-absorbing oligomer comprise the same third divalent unit.

5. The composition of claim 1, wherein each first divalent unit is independently represented by formula:

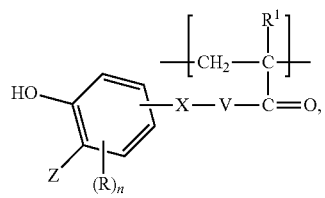

wherein
$R^1$ is independently hydrogen or methyl;
V is O or NH;
X is a bond, alkylene, or alkyleneoxy, wherein the alkylene or alkyleneoxy have from 1 to 10 carbon atoms and are optionally interrupted by one or more —O— groups and optionally substituted by a hydroxyl group;
R is alkyl having from one to four carbon atoms;
n is 0 or 1; and
Z is a benzoyl group optionally substituted by hydroxyl, alkyl, halogen, or hydroxyl; a 4,6-bisphenyl[1,3,5]triazin-2-yl group wherein each phenyl is optionally independently substituted by one or more alkyl or alkoxy groups; or a 2H-benzotriazol-2-yl group optionally substituted by one or more halogens.

6. The composition of claim 5, wherein at least some of the first divalent units in the ultraviolet light-absorbing oligomer comprise different Z groups.

7. The composition of claim 5, wherein the composition comprises a second, different ultraviolet light-absorbing oligomer in the blend, and wherein the first divalent units in the ultraviolet light-absorbing oligomer and in the second, different ultraviolet light-absorbing oligomer comprise different Z groups.

8. The composition of claim 1, wherein the ultraviolet light-absorbing oligomer is in the composition in an amount ranging from 0.5 percent to 25 percent by weight, based on the total weight of the composition.

9. An article comprising the composition of claim 1, wherein the article is a photovoltaic device, vehicle wrap, graphic film, architectural film, or window film.

10. An assembly comprising:
a first polymeric film substrate having a first surface and a second surface opposite the first surface;
a barrier film disposed on the first surface of the first polymeric film;
a pressure sensitive adhesive layer having a first surface and a second surface opposite the first surface, wherein the first surface of the pressure sensitive adhesive layer is disposed on the barrier film opposite the first polymeric film substrate; and
a second polymeric film substrate disposed on the second surface of the pressure sensitive adhesive layer,
wherein the pressure sensitive adhesive layer comprises a blend of a pressure sensitive adhesive and an ultraviolet light-absorbing oligomer, wherein the ultraviolet light-absorbing oligomer comprises:
first divalent units comprising a pendent ultraviolet absorbing group, wherein the pendent ultraviolet absorbing group comprises a triazine, a benzophenone, or a benzotriazole; and
second divalent units represented by formula:

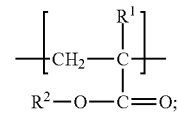

wherein
$R^1$ is hydrogen or methyl; and
$R^2$ is alkyl having 8 carbon atoms,
wherein the second divalent units are present in the ultraviolet light-absorbing oligomer at 70 percent by weight up 90 percent by weight, based on the total weight of the oligomer, wherein the pressure sensitive adhesive is an acrylic pressure sensitive adhesive comprising an acrylic polymer, wherein the second divalent units are present in the acrylic polymer in an amount of 80 percent by weight up to 100 percent by weight, based on the total weight of the acrylic polymer, wherein the ultraviolet absorbing group is in the pressure sensitive adhesive layer in an amount of at least 2 percent by weight and in an amount up to 10 weight percent, based on the total weight of the pressure sensitive adhesive layer, and wherein the pressure sensitive adhesive does not comprise a third divalent unit comprising a pendent hydroxyl group.

11. The assembly of claim 10, wherein the barrier film comprises at least first and second polymer layers separated by an inorganic barrier layer.

12. The assembly of claim 10, further comprising an encapsulant layer on which the first polymeric film substrate is disposed.

13. The assembly of claim 12, wherein the encapsulant layer is on a photovoltaic cell.

14. The assembly of claim 10, wherein at least one of the pressure sensitive adhesive or the ultraviolet light-absorbing oligomer further comprises a third divalent unit comprising a pendent carboxylic acid, aminocarbonyl, alkylaminocarbonyl, or dialkylaminocarbonyl group.

15. The assembly of claim 14, wherein both the pressure sensitive adhesive and the ultraviolet light-absorbing oligomer comprise the same third divalent unit.

16. The assembly of claim 10, wherein each first divalent unit is independently represented by formula:

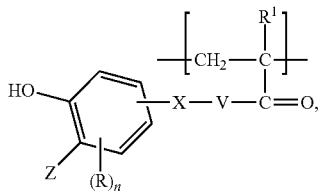

wherein $R^1$ is independently hydrogen or methyl;

V is O or NH;

X is a bond, alkylene, or alkyleneoxy, wherein the alkylene or alkyleneoxy have from 1 to 10 carbon atoms and are optionally interrupted by one or more —O— groups and optionally substituted by a hydroxyl group;

R is alkyl having from one to four carbon atoms;

n is 0 or 1; and

Z is a benzoyl group optionally substituted by hydroxyl, alkyl, halogen, or hydroxyl; a 4,6-bisphenyl[1,3,5]triazin-2-yl group wherein each phenyl is optionally independently substituted by one or more alkyl or alkoxy groups; or a 2H-benzotriazol-2-yl group optionally substituted by one or more halogens.

17. The assembly of claim 16, wherein at least some of the first divalent units in the ultraviolet light-absorbing oligomer comprise different Z groups.

18. The assembly of claim 16, wherein the pressure sensitive adhesive layer comprises a second, different ultraviolet light-absorbing oligomer in the blend, and wherein the first divalent units in the ultraviolet light-absorbing oligomer and in the second, different ultraviolet light-absorbing oligomer comprise different Z groups.

19. The assembly of claim 10, wherein the ultraviolet light-absorbing oligomer is in the pressure sensitive adhesive layer in an amount ranging from 0.5 percent to 25 percent by weight, based on the total weight of the pressure sensitive adhesive layer.

* * * * *